(12) United States Patent
MacMullen

(10) Patent No.: US 6,484,124 B1
(45) Date of Patent: Nov. 19, 2002

(54) SYSTEM FOR MEASUREMENT OF SELECTED PERFORMANCE CHARACTERISTICS OF MICROWAVE COMPONENTS

(75) Inventor: Alexander MacMullen, Rancho Palos Verdes, CA (US)

(73) Assignee: Technology Service Corporation, Silver Spring, MD (US)

( * ) Notice: Subject to any disclaimer, the term of this patent is extended or adjusted under 35 U.S.C. 154(b) by 0 days.

(21) Appl. No.: 09/576,318

(22) Filed: May 22, 2000

(51) Int. Cl.[7] .............................................. G01R 23/02
(52) U.S. Cl. ..................................... 702/182; 324/76.19
(58) Field of Search .................................. 324/612, 615, 324/618, 619, 707, 76.12, 76.19, 76.22, 76.23, 76.24; 455/205, 226.7, 309; 702/57, 60, 65, 66–68, 71, 72, 75, 81, 108, 117, 121, 190

(56) References Cited

U.S. PATENT DOCUMENTS

| | | | |
|---|---|---|---|
| 3,101,446 A | 8/1963 | Glomb et al. | 363/67 |
| 3,287,646 A | 11/1966 | Taylor | 325/363 |
| 3,743,932 A | 7/1973 | Newman et al. | 324/140 D |
| 3,825,835 A | 7/1974 | Hammett et al. | 325/363 |
| 4,004,230 A | 1/1977 | Campbell et al. | 325/363 |
| 4,172,263 A | 10/1979 | Tenten et al. | 358/139 |
| 5,386,495 A | 1/1995 | Wong et al. | 375/10 |
| 5,465,412 A | 11/1995 | Mueller et al. | 455/296 |

*Primary Examiner*—Marc S. Hoff
*Assistant Examiner*—Edward Raymond
(74) *Attorney, Agent, or Firm*—Collier Shannon Scott, PLLC

(57) ABSTRACT

An improved process and apparatus for measuring performance characteristics of microwave power components. The invention involves the use of a rotating phase reference technique to improve measurement. The process and apparatus result in fast, accurate, reproducible determination of the desired properties. In addition, the apparatus of the present invention is lightweight, compact, and portable.

64 Claims, 15 Drawing Sheets

SYSTEM FOR MEASUREMENT OF SELECTED PERFORMANCE CHARACTERISTICS OF MICROWAVE COMPONENTS

This invention was made with Government support under SBIR Phase I Grant, Contract No. N00164-96-C-0059, awarded by the Naval Surface Warfare Center, Crane Indiana, and SBIR Phase II Grant, Contract No. N00164-98-C-0055, awarded by the United States Navy, Naval Surface Warfare Center (NSWC), Crane Division. The U.S. Government has a paid-up license in this invention and the right, in limited circumstances, to require the patent owner to license others on reasonable terms, as provided for by the terms of Contract No. N00164-98-C-0055, awarded by NSWC Crane.

FIELD OF THE INVENTION

The present invention relates to an improved system for measuring selected performance characteristics of electronic components. In one preferred embodiment, the present invention comprises a method and apparatus for evaluating selected performance criteria of microwave power components, and in particular, microwave transmitter and receiver components. The present invention comprises improvements that individually or in combination increase the accuracy, reproducibility, and speed of these determinations, in a system that is lightweight, portable, and low cost, relative to prior known devices.

BACKGROUND OF THE INVENTION

Microwave components have long been critical features of radar systems, electronic devices, and other systems. Errors in the parameters of microwave components translate directly into decreased accuracy and precision of the equipment, systems, and processes in which they are employed. There has long been a need to improve the accuracy, reliability, repeatability, and correlation of signal-to-noise ratio ("SNR") measurements of microwave power transmitter and receiver components. Prior to the present invention, a relatively high degree of variability existed between test sites, as well as between test sets at the same test site. Improvement in the accuracy of the performance characteristics of microwave components contributes directly to improved accuracy and precision in the systems in which they are used. Prior approaches have not adequately met this need. In response to this need, a self-calibrating measurement technique having improved speed, accuracy, repeatability, and portability of the present invention has been developed.

Many microwave transmitters have stringent requirements on their output signal-to-noise ratio ("SNR"). For example, in a pulsed radar system, the transmitter SNR can limit the ability of the radar to detect and/or track weak targets against a background of echoes from the earth's surface (clutter). The techniques commonly used prior to the present invention to measure transmitter and microwave tube SNR can have errors of ±1.5 dB. As a result, there has been poor agreement among SNR measurements made at the component factory, transmitter manufacturer, system integrator, and end user. This lack of agreement causes disputes over product acceptance, results in rejection of components meeting specification and acceptance of components failing to meet specification, creates unnecessary product returns, and generates wasteful requests to retest components. Moreover, the prior known methods for determining the performance characteristics of microwave power components, and in particular SNR, were: cumbersome; time consuming; expensive; and involved the use of large, heavy, bulky, and expensive equipment to carry out the analysis.

Prior to the present invention, microwave components have been tested in a test setup of the type depicted in the right-hand portion of FIG. 1. The right-hand portion of FIG. 1 depicts a test set up used for evaluating a component under test, in this example, a microwave power tube (or transmitter). A radio frequency (rf) drive signal was supplied to the component. The rf output from the component under test was applied to a vector demodulator circuit which, converted it into in-phase (I) and quadrature (Q) video signals. The rf drive signal to the component was also used as the reference (local oscillator) input to the demodulator as shown in FIG. 1. The signals were then digitalized and filtered. In the test setup depicted in FIG. 1, a Tektronix RTD-710A digitizer, sampling at 50 Msa/sec, was used to convert the I and Q video signals into 10-bit digital format. Analog 5 MHZ 6-pole Bessel filters at the inputs of the digitizer channels were used to define the bandwidth in which the tube noise is measured, i.e. ±5 MHZ about the carrier. For pulsed radar tubes, the digitized data was captured in a 2-microsecond window located near the middle of the pulse. The raw data was then transferred to a general purpose digital computer. Application software compensated the data for pulse-to-pulse variations caused by the modulator, and computed the average intrapulse SNR referenced to a 1 MHZ bandwidth. This conventional technique, however, took substantial amounts of time per measurement and resulted in SNR measurements with an error of ±1.5 dB.

The inventor observed that accuracy of prior known methods was limited by vector demodulator errors, which could be removed by lengthy calibration procedures. Specifically, there are both linear and non-linear error sources in the measurement of microwave power components.

Linear Distortion: An ideal vector demodulator (VDM) generates a unit circle centered at the origin on the IQ plane. The I and Q video output voltages are defined by the equations:

$$I = kA \cos \theta$$
$$Q = kA \sin \theta$$

where
  A=rf signal voltage
  k=mixer conversion loss
  θ=phase angle of rf signal with respect to the LO Plotting I and Q data from a real vector demodulator generated an elliptical locus displaced from the origin as shown in FIG. 2. The inventor observed that this linear distortion resulted from three error sources:

DC Offset—Imbalances in the mixer diodes and transformers create low level dc outputs in the I and Q channels when the local oscillator signal is applied. This causes displacement of the center of the locus from the origin. These offsets are a function of the measurement frequency and, if not compensated, cause a few tenths of a dB error.

I/Q Channel Gain Imbalance—This difference in gain between I and Q channels changes the locus into an ellipse with its principal axes parallel to the I and Q axes. Factors which contribute to gain imbalance include variations in:

rf power split into the I and Q channel mixers;
VSWR of the mixer rf ports;
mixer conversion loss;
insertion loss of video filters;
digitizer channel gains;

The first three items were considered by the present inventor to be dominant, and varied as a function of the test frequency.

Quadrature Error—Quadrature error causes the principal axes of the elliptical locus to tilt relative to the I/Q axes and results from the I and Q channel phases differing from 90 degrees. Differential phase errors are caused by:

The rf power splitters used to supply RF and LO to the I and Q mixers;
Rf line lengths; and
Mixer VSWRs.

These errors are also functions of the test frequency. These three linear distortions were determined by the inventor to be the major causes of SNR measurement inaccuracy.

The distorted I and Q voltages take the form:

$$I = kA\left(1 - \frac{C}{2}\right)\cos\left(\theta - \frac{D}{2}\right) + B\cos E$$

$$Q = kA\left(1 + \frac{C}{2}\right)\sin\left(\theta + \frac{D}{2}\right) + B\sin E$$

where $C$ = gain imbalance;

$D$ = quadrature error $B$ = dc offset amplitude $E$ = dc offset phase relative to the I axis $$C_{dB} = 2\log\left|\frac{1 + \left(\frac{C}{2}\right)}{1 - \left(\frac{C}{2}\right)}\right|$$

FIG. 3 illustrates the linear distortion in a typical vector demodulator. A gain imbalance of ±1 dB and a phase error of ±6 degrees are typical values. These errors are attributed to mixer Voltage Standing Wave Ratios ("VSWRs"), which can be in the range 3.0:1. In addition, this vector demodulator (VDM) shows a bias in the phase of about −8 degrees. This is attributed to a small differential error (c. 0.05 inches) in the rf line lengths feeding the I/Q mixers. The dc offset for this VDM is on the order of 1%, and is a small error source.

Non-Linear Distortion—Prior to the present invention, the LO to signal ratio typically was not tightly controlled. The inventor observed that non-linear distortion generated in the demodulator could be made negligible by maintaining the signal amplitude 15 dB below the LO reference level. The LO/signal ratio was typically only 8 dB, where considerable amplitude compression was readily observable.

The calibration procedure of prior known methods typically required considerable time (3–5 seconds or longer) and entailed relatively large errors (±2dB). The procedure of the present invention speeds the assessment and removes these errors by implementing a local oscillator (LO) offset frequency technique, and digital signal processing of the video data. Specifically, the invention employs a Rotating Phase Reference ("RPR") technique to improve accuracy. The invention may also use digital filters to create a precise noise bandwidth, and to significantly reduce the noise floor of the measurement. The technique of the present invention is suitable for use in both Government and commercial applications. The improved accuracy of the present invention results in far better agreement between tube vendors, equipment integrators, and the final customer, leading to lower costs by increasing equipment acceptance.

Others, prior to the present invention, have sought to develop methods of real-time measurement of signal-to-noise ratio. None, however, employ the RPR technique of the present invention.

One method for determining signal-to-noise ratio is described in Glomb, U.S. Pat. No. 3,101,446 for Signal-to-Noise Ratio Indicator (Aug. 20, 1963). Glomb discloses a signal-to-noise ratio indicator for a communication system that employs a combination of a low frequency sine wave and out of band noise.

Another patent issued to Taylor, U.S. Pat. No. 3,287,646 for Signal-To-Noise Ratio Meter (Oct. 28, 1963), discloses a meter for the direct measurement of the signal-to-noise ratio of a modulated continuous wave that has noise level superimposed on it. Taylor's method involves mixing the incoming (noisy) signal with a different frequency oscillation and performing a series of limiting and filtering steps.

Newman, U.S. Pat. No. 3,743,932 for Clipped Correlation to Signal-to-Noise Ratio Meter (Jul. 3, 1973), discloses a circuit for converting the output of a clipper correlator to signal-to-noise ratio in a signal from a sonar array.

Hammett, U.S. Pat. No. 3,825,835 for Signal-to Noise Ratio Measurement (Jul. 23, 1974), discloses a system and apparatus for the measurement of signal-to-noise ratio in electrical signals. Hammett notes that the two prior methods known at that time for measurement of signal-to-noise ratio are complex and/or extremely bulky. Col. 1, at 11. 43–50. Although Hammett discloses what he describes as a "portable" system, that system employs cathode-ray oscilloscope equipment that is considerably more complex, bulky, costly, and heavy than the apparatus of the present invention.

Campbell, U.S. Pat. No. 4,004,230 for Critical Parameter Receiver Tester (Jan. 18, 1977), discloses test equipment on which a modulated signal is injected into a receiver under test. The output is fed directly to a first power measuring device, then through a digital filter, to a second measuring device. The two measured quantities are then fed to a divider circuit which provides an indication of the signal-to-noise ratio.

Tenten, U.S. Pat. No. 4,172,263 for Methods and Apparatus for Measuring Signal-to Noise Ratio (Oct. 23, 1979), discloses a method and apparatus for measuring signal-to-noise ratio in video waveforms, based upon tangential noise measurement principles.

Wong, U.S. Pat. No. 5,386,495 for Method and Apparatus for Determining the Signal Quality of a Digital Signal (Jan. 31, 1995), discloses a receiver for receiving and decoding a carrier signal. The carrier signal is modulated with a digital signal. The receiver signal is demodulated and converted into digital format. A digital signal processor is then used to calculate the signal-to-noise ratio.

Mueller, U.S. Pat. No. 5,465,412 for Apparatus and Method for Determining a Point in Time for Detecting a Sampled Signal in a Receiver (Nov. 7, 1995), discloses a system adapted for mobile communications systems.

None of the prior known methods and devices achieves the rapid, high resolution measurement of signal-to-noise ratio of the present invention. Moreover, none of them has been able to improve substantially the accuracy of prior measurement methods through a light weight, portable measurement device or system. The present invention overcomes many of the drawbacks of prior methods and greatly improves the accuracy, ease, and precision of measurement, its reproducibility, and results in greater reliability of the systems in which the components are used. Specifically, the technique of the present invention results in an accuracy of better than about 0.1 dB, in contrast to errors of ±1.5 dB, typical in prior techniques. The repeatability of the measurement of signal-to-noise ratio depends primarily on the number of independent noise samples taken. The present invention facilitates the rapid measurement of parameters and, hence, the measurement of a larger number of samples, improving accuracy. In addition, the apparatus of the present invention is faster, smaller, less expensive, and more robust and light weight than prior apparatus and methods.

The present invention is the result of several years' development work. In a 1994 paper, entitled *High Accuracy Signal/Noise Measurement of Microwave Power Amplifiers* (the "1994 paper"), by the inventor, Alexander MacMullen, of Technology Service Corporation, and Steve Hillenberg, NSWC, Crane Division, the inventor's contact at the U.S. Navy's Crane Laboratory, the authors disclose many of the problems involved in improving the accuracy of measurements of the properties of microwave power components and outline a general conceptual path toward a solution. Papers describing the work were presented at the 1994 Microwave Power Tube Conference, the IEEE/MTTS Automatic RF Techniques Group ("ARFTG"), and were published in NASA Technical Briefs, and elsewhere. That 1994 paper, as well as each of the IEEE/MTTS, ARFTG, and NASA papers, are hereby incorporated by reference, as if fully set forth herein. Although the 1994 paper describes, in general terms, the basic RPR concept involved in the system of the present invention to achieve an accuracy of better than 0.1 dB, it does not disclose the system, apparatus, or process of the present invention.

The 1994 paper discloses that an analysis of the demodulator circuit was performed to see how the major error sources could be eliminated or reduced. It was determined that the vector demodulator components were already of the highest quality commercially available and, therefore, it was impractical to improve their characteristics without tedious and time-consuming tuning, matching, and adjustment. Very high-level mixers were selected for the demodulator. These units, Anaren model 76127, were operated with an LO level of +18 dBm. The third order intercept point was above +24 dBm. With a signal level of +3 dBm, non-linear distortion products were reported to have been negligible.

The measurement procedure employed in the 1994 paper used a hardware configuration of the type shown in FIG. 1. In contrast to the prior technique, in which the rf drive signal was supplied to both the test component and as the local oscillator input to the vector demodulator, the LO reference signal was offset in frequency from the rf signal by a small amount, and data was collected over a time base $T=N/\Delta f$, where $\Delta f$=LO frequency offset and N is an integer. The data values were uniformly distributed over all values of $\theta$ and any cyclic errors could be removed by averaging.

As an example, a pulsed S-band crossed-field amplifier tube was operated at a prf of 2000 Hz. The frequency offset was adjusted to 20 Hz. Data was collected over a time base of 0.05 seconds, or 100 pulses. Each pulse had an incremental phase of 3.60 degrees. Over the total data base, the accumulated phase was 360 degrees.

The digitized I and Q data were transferred to the computer where the mean values in each pulse window were calculated. The data were normalized to remove pulse-to-pulse variations which may have been generated by the pulse modulator. The variances of the normalized data were computed and summed to yield the total noise power in each pulse. Results from all pulses were averaged. Finally, the signal-to-noise ratio was computed for the entire group of pulses in the data base. The errors caused by linear distortion were removed because the average of sinusoidal functions over N cycles is zero.

Based upon this technique, the 1994 paper reports improved accuracy of SNR measurements on microwave tubes and transmitters of about 0.1 dB rms, compared to ±1.5 dB in previous known procedures. Nonetheless, the disclosure of the 1994 Paper retained a number of the drawbacks of prior techniques. Although the technique disclosed in the 1994 Paper was more accurate than prior known techniques, the process remained slow, on the average of 3 to 5 seconds per measurement. The instrumentation used was large, heavy, bulky, and expensive, industrial grade equipment. The system was not portable. Two microwave signal generators, operating at slightly offset frequencies, produced the Rotating Phase Reference (RPR). This had two distinct disadvantages: (1) the second microwave synthesizer was costly, and (2) the phase noise of the two synthesizers was cumulative, creating a high measurement noise floor. The only performance parameter evaluated in the 1994 paper was SNR. The number of measured phases was substantial. None of the details of the process, algorithms, or software employed were disclosed.

The inventor has made significant improvements in various elements and components of the work described in the 1994 Paper. The present invention represents a significant advance over prior know methods of signal-to-noise ratio measurement. High accuracy has been retained. Many of the functions have been converted from hardware- to software-based systems. The number of phases at which data are collected has been reduced. The present invention uses standard, off the shelf, readily available components, is more lightweight, and is easily portable. In addition, the present invention offers the significant improvements in the speed of measurement of signal-to-noise ratio. This improvement was made possible by two innovations: (1) the rapid transfer of data between components of the testing system; and (2) employing a special purpose, high speed, digital processor rather than a general purpose digital computer. The inventor has made additional improvements to speed up the processing of the raw data acquired during the RPR measurement and provide operators with an SNR vs. frequency display in two seconds. This represents an increase in speed of about 3000:1 relative to prior known techniques and several times the speeds reported in the 1994 paper.

The present invention is useful to accurately and rapidly measure and display SNR (and its related parameters, moving target indication (MTI) and clutter attenuation (CA), and other fundamental parameters of microwave components such as insertion phase, gain, and time delay.

OBJECTS OF THE INVENTION

It is therefore an object of the present invention to provide a process and apparatus to improve the accuracy of SNR measurements on microwave components, including but not limited to tubes, transmitters, and other electronic components.

Another object of the present invention is to improve the accuracy of SNR measurements to approximately ±0.1 dB, or better.

An object of the invention is to reduce the time required to make accurate signal-to-noise ratio measurements in less than 3 to 5 seconds.

A further object of the present invention is reduce errors in SNR measurement by employing a reference LO shifted in phase from the signal to the demodulator.

Yet, a further object of the present invention is the use of a Rotating Phase Reference (RPR) technique to improve the accuracy of determination of performance parameters of electronic components.

An additional object of the present invention is to improve the reproducibility of measurement of selected performance characteristics of microwave power components.

Yet another object of the present invention is to decrease the time required to measure selected performance characteristics, while maintaining a high degree of accuracy.

Another object of the present invention is to provide a system for the measurement of selected performance characteristics of microwave power components that is portable and light weight.

A further object of the present invention is to employ a Rotating Phase Reference (RPR) technique to improve the accuracy and speed of the measurement of selected performance characteristics of microwave power components.

An additional object of the present invention is to improve the accuracy and repeatability of measurement by automating data collection.

Yet another object of the present invention is to improve the accuracy of determination of performance parameters of electronic components by automating the processing of the collected data.

A further object of the present invention to provide a standard measurement technique and apparatus for the determination of selected performance characteristics of microwave power components.

Another object of the present invention is to provide a rugged measurement system that is portable.

Yet another object of the invention is to provide a measurement system that is light weight.

A further object of the present invention is to improve the accuracy of phase, gain, signal to noise, time delay measurements, and system stability.

Another object of the present invention is to provide a system for determining performance parameters of electronic components that weighs less than about 120 pounds.

An additional object of the present invention is to provide a system for determining performance parameters of electronic components that weights less than about 50 pounds.

A further object of the present invention is to provide a system for determining performance parameters of electronic components having a package that is smaller than about 3,000 cubic inches.

An additional object of the present invention is to provide a system that employs improved accuracy based upon an increased number of measurements at a reduced number of phases.

Additional objects and advantages of the invention are set forth, in part, in the description which follows and, in part, will be obvious from the description or may be learned by practice of the invention. The objects and advantages of the invention will be realized in detail by means of the instrumentalities and combinations particularly pointed out in the appended claims.

BRIEF SUMMARY OF THE INVENTION

As illustrated in the accompanying diagrams and disclosed in the accompanying claims, the invention is a method for the measurement of selected fundamental performance parameters of test unit, comprising:

a. generating a first reference signal;

b. generating a second reference signal, that is rotated in phase relative to said first reference signal;

c. Supplying said first reference signal to the test unit;

d. Supplying the output of the test unit to vector demodulator means;

e. Supplying said second reference signal to vector demodulator means;

f. Generating a signal from vector modulator means;

g. Processing said signal from said vector demodulator means to determine the selected fundamental performance parameters of the test unit.

In another embodiment, the present invention is an apparatus for the measurement of fundamental parameters of a test unit, comprising:

a. first signal generator means, for generating a first signal having first phase;

b. phase shifter means, cooperating with said first signal generator means, for rotating the phase of said first signal to produce a second signal having a second phase, wherein said second signal is shifted in phase relative to said first signal;

c. test unit input means, for supplying said first signal to said test unit input means, d. demodulator means, for accepting an rf signal from the test unit, e. means for supplying said second signal to said demodulator means, f. data processing means for computing the fundamental parameter of the test unit from the output of said digitizer.

The invention is a PC-based test instrument that performs high accuracy, quantitative measurements of microwave components over the 2 to 18 Ghz frequency band. Used with a conventional synthesizer that sweeps over user-specified frequencies, the MCA analyzes the CW or pulse output from the device under test and generate the following measures: Signal-to-Noise Ratio; Insertion Gain; and Insertion Phase. The invention includes the MCA, a GPIB compatible synthesizer, a power divider, and the device under test (DUT). The MCA controls the synthesizer sweep using gain and frequency parameters defined by the operator. The power divider provides the RF stimulus to the DUT and a reference signal for the MCA.

The invention measures the output Signal-to-Noise Ratio (SNR), insertion gain and phase of the DUT under continuous wave (CW) or pulsed conditions. For pulsed waveforms, the invention synchronizes its measurements to an externally supplied trigger. For CW waveforms, the invention generates its own internal 1 KHz trigger. The MCA operates at discrete frequencies over any portion of the 2–8 GHz band. Once enabled by the operator, the invention automatically scans the programmed frequencies, collects and processes data for each frequency, and displays results on the invention's display. The display connects the individual measurement points with a line for clarity and then repeats the measurement process until stopped by the operator. This allows the user to make adjustments to the DUT and immediately observe the results.

The invention sends frequency information to a digitally controlled frequency synthesizer via the IEEE-488 bus. Software drivers for Hewlett Packard Models 8672A and 836x series synthesizers are supplied. The number of frequencies and the frequency steps chosen must be compatible with the particular synthesizer used. The invention also controls the amplitude of the synthesizer output. It is recommended that the synthesizer amplitude be set to at least +13 dBm. This will return the nominal reference input amplitude of +10 dBm after a 3 dB loss in the passive power splitter.

The invention comprises a commercial off-the-shelf (COTS) personal computer (PC) and TSC-designed electronic modules housed in a rugged aluminum, portable chassis. The host processor is a Pentium III with a 15.1-inch, high brightness, active matrix TFT. The integral keyboard/pointing device is sealed and water-resistant. A plug-in IEEE-488, GPIB controller is used to control the external synthesizer.

In addition to the COTS components, the chassis houses two, TSC-designed plug-in circuit boards—a RF Module and a Digital Signal Processor (DSP). These modules include phase shifter and vector demodulator circuits, two 12-bit, 50 MHZ analog to digital converters, and a high-performance DSP that implements rotating phase reference (RPR) algorithms to generate the outputs.

Once enabled by the operator, the invention automatically steps through the specified frequencies and graphically displays the results on its display screen in a matter of seconds. Numerical results can be saved to disk for further review and analysis or can be viewed on the screen at any time.

The invention's graphical user interface was developed using LabVIEW for Windows. It provides familiar-looking, virtual instrument panel that includes indicators and controls that are manipulated using the keyboard and/or pointing device (mouse).

It is to be understood that both the foregoing general description and the following detailed description are exemplary and explanatory only, and are not restrictive of the invention as claimed. The accompanying drawings, which are incorporated herein by reference, and constitute a part of the specification, illustrate certain embodiments of the invention, and together with the detailed description, serve to explain the principles of the present invention.

DETAILED DESCRIPTION OF THE PREFERRED EMBODIMENTS

Figure 5:
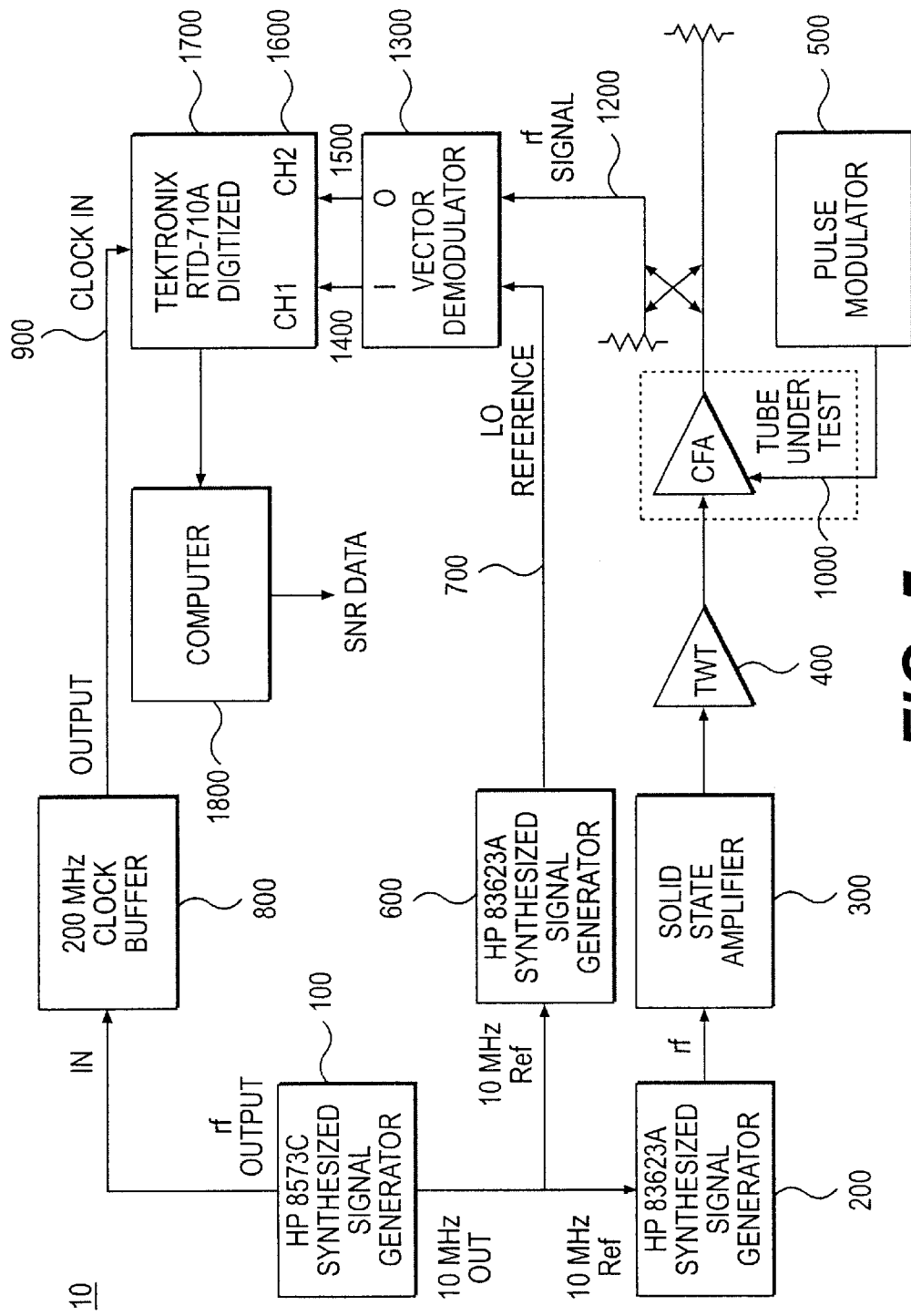
FIG. 5 is a diagram of an embodiment of the present invention.
Figure 6:
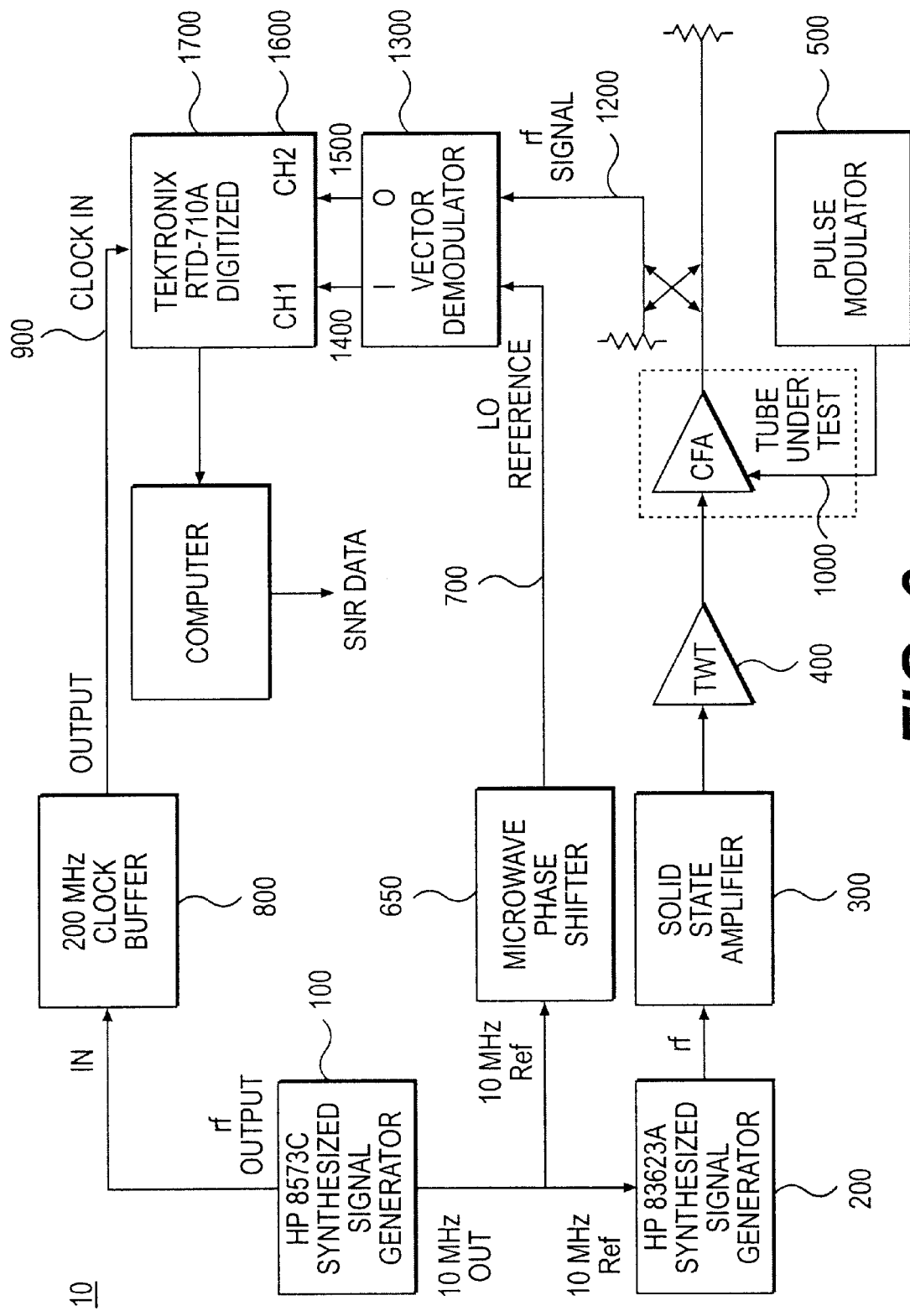
FIG. 6 is a diagram of an embodiment of the present invention.

Reference will now be made in detail to a preferred embodiment of the microwave component analyzer of the present invention, an example of which is illustrated in the accompanying drawings. A present preferred embodiment of the present invention is shown in FIGS. 5 and 6 as 10. FIG. 4 depicts a preferred embodiment of the present invention in a process flowchart, showing and describing the steps for improving the accuracy, speed, and repeatability of measurement of selected characteristics of microwave power components. A present preferred embodiment of the present invention is depicted in detail in the User's Manual for Technology Service Corporation's Model 100A Microwave Component Analyzer, which is incorporated herein by reference, as if fully set forth herein.

The Method of the Invention

Figure 1:
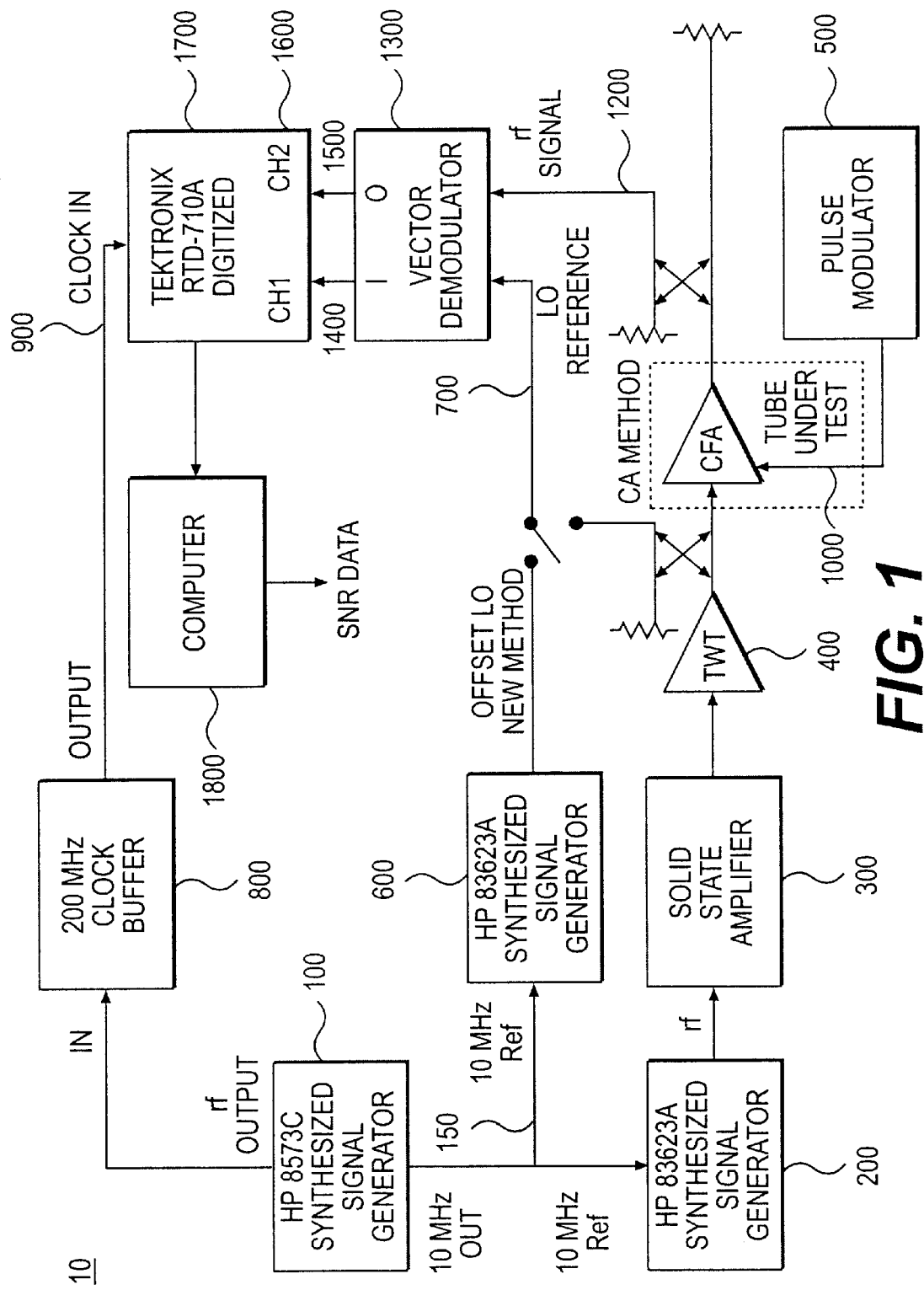
FIG. 1 is a diagram of a signal-to-noise ratio (SNR) measurement system showing one embodiment of the present invention along with a prior known technique for measuring a pulsed crossed field amplifier tube.
Figure 2:
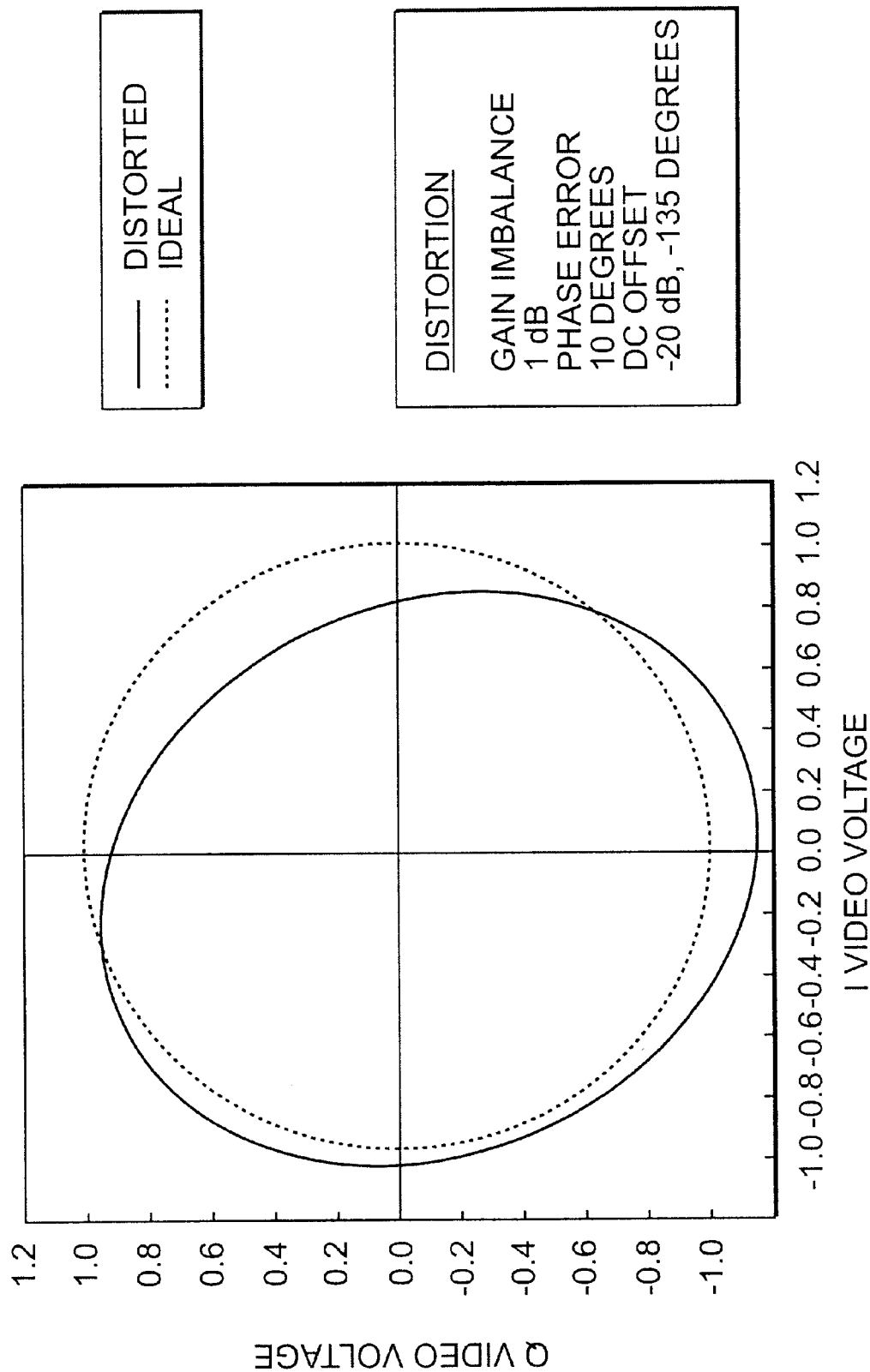
FIG. 2 is a graph depicting the outputs of an ideal and a practical vector demodulator.

As depicted in the flow chart of FIG. 4, and of FIGS. 1, 5, and 6, the present invention is a system, method, and apparatus for determining selected performance characteristics of electronic components. In a present preferred embodiment of the invention, the data is gathered automatically and then may be used to assess a number of different performance parameters. A preprocessing step may be performed, as depicted in FIG. 4*a*. Specifically, vector demodulator (VDM) corrections may be performed, as shown in FIG. 4b. The data is sampled at a preselected interval(s). This data is then used as the input to a number of different measurement techniques to determine various performance parameters of the electronic components under test. For example: signal-to-noise ratio (FIG. 4*d*.); Moving Target Indicator (MTI) (FIG. 4*c*.); Clutter Attenuation (CA) (FIG. 4*f*.) and insertion phase and gain, may be evaluated. Final estimates may then be prepared, as depicted in FIGS. 4*g*. and 4*h*.

It will be apparent to persons of ordinary skill in the art that various modifications and variations may be made to the process of the present invention without departing form the scope or spirit of the invention as claimed. For example, data may be measured for various performance parameters independently. The protocol and measurement parameters (e.g., sensitivity, digital filter settings, and other measurement parameters) may be modified for various of the performance parameters of interest. One or more only of the various performance parameters may be assessed. Various of the performance assessments may be eliminated and/or modified. Various algorithms may be used, that are the same or different as those described in FIG. 4. Various hardware and/or software configurations and techniques are readily available to perform the desired calculations in addition to those depicted in FIGS. 1, 5, and 6 and would be understood by persons of ordinary skill in the art as equivalent to them. The speed and accuracy of the assessment may be modified depending on the number and phases at which data is measured, as well as various other measurement parameters. Any of the measurement and calculation parameters may be adjusted to the circumstances, provided the system retains its ability to make accurate, rapid measurements of selected performance parameters. Thus, it is intended that these variations and modification be considered part of the invention, provided they come within the scope of the appended claims and their equivalents.

The Apparatus of the Present Invention

Alternative hardware configurations of an apparatus for measuring signal-to-noise ratio are depicted in FIGS. 1, 5, and 6. As embodied herein (FIG. 1), the invention comprises: signal generator means 100, rotation phase reference means 200, demodulator means 1300, and analysis means 1800.

As embodied herein, the signal generator means 100, provides a signal to both the rotation phase reference means 150 and test component 1000. The test component being evaluated 1000 generates a test component signal 1200. The resulting signals (namely, the rotated phase reference signal 700 and the test component signal 1200), are both provided to demodulator means 1300. Vector Demodulator means 1300 generates one or more signals that are supplied to analysis means 1800, from which the performance parameters of interest are assessed. Output may then be displayed in the desired fashion using any of a variety of display technologies that are well known in the art.

It will be apparent to persons of ordinary skill in the art that modifications and variations of the invention, and the individual components of the invention, may be made without departing from the scope or spirit of the invention as claimed. For example, signal generator means 100 may be a standard synthesized signal generator or any other technique capable of generating a suitable reference signal for use in determining the performance parameters of the test component. Rotation phase reference means 150 may be a second signal generator means 600 (FIGS. 1 and 5) or microwave phase shifter 650. Clock 800 and digitizer means 900 may be used, or any of various techniques to coordinate and synchronize the signal processing of the test stand may be substituted, provided the invention achieves high accuracy measurement of selected performance parameters in real-time. Clock 800, digitizer 900, vector demodulator 1300, and analyzer 1800, may be separate components, may be digital or analog-based systems, and/or may be embedded in hardware, coded, or written into application or operating system software in a PC-based or other hardware system. Thus, it is intended that the variations and modifications be considered part of the invention, provided they come within the scope of the appended claims and their equivalents.

Alternative embodiments of the apparatus of the present invention are depicted in FIGS. 1, 5, and 6. In one embodiment of the present invention, the invention comprises: Signal Generator 100, Signal Generator 200, Solid State Amplifier 300, TWT (to Test Tube and LO Reference) 400, Pulse Modulator (to Test Tube) 500, HP 83623A Synthesized Signal Generator 600, Offset LO Reference Signal (to Vector Demodulator) 700, 200 MHZ Clock Buffer 800, Clock in Signal (to Digitizer) 900, Tube Under Test 1000, rf drive signal 1200, Vector Demodulator Circuit 1300, In-Phase Video Signal 1400, Quadrature Video Signal 1500, Digitizer 1600, Bessel Pole filters 1700, and Personal Computer 1800.

In a preferred embodiment of the present invention, the second Synthesized Signal Generator 600 has been replaced by rotating phase reference means 150. As embodied herein, rotating phase reference means 150 is a Microwave Phase Shifter 650, assembled from Conventional Off the Self (COTS) components. In alternative embodiments of the present invention, either of the signal generator 100 or rotating phase reference 150 means may be replaced by any other suitable means for generating input and reference signals.

In an embodiment of the present invention, a pulsed S-band crossed-field amplifier tube was operated at a prf of 2000 Hz. The frequency offset was adjusted to 20 Hz. Data was collected over a time base of 0.05 seconds, or 100 pulses. Each pulse had an incremental phase of 90 degrees. Over the total data base, the accumulated phase was 360 degrees.

The digitized I and Q data are transferred to the computer 1800 where the mean values in each pulse window are calculated. The data are normalized to remove pulse-to-pulse variations which may be generated by the pulse modulator. The variances of the normalized data are computed and summed to yield the total noise power in each pulse. Then, the results from all pulses are averaged.

Figure 3:
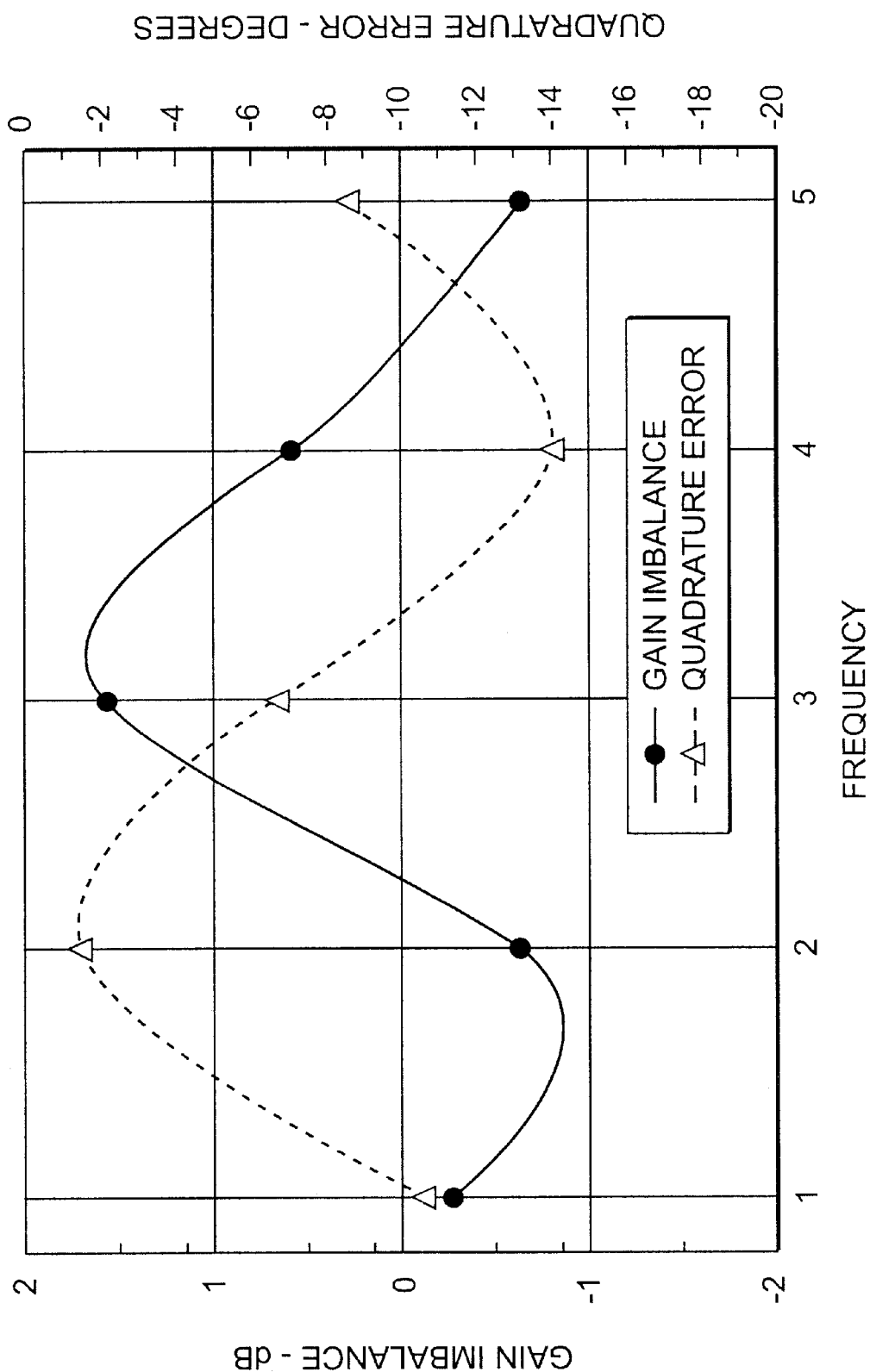
FIG. 3 is a graph of typical vector demodulator distortions.
Figure 4A:
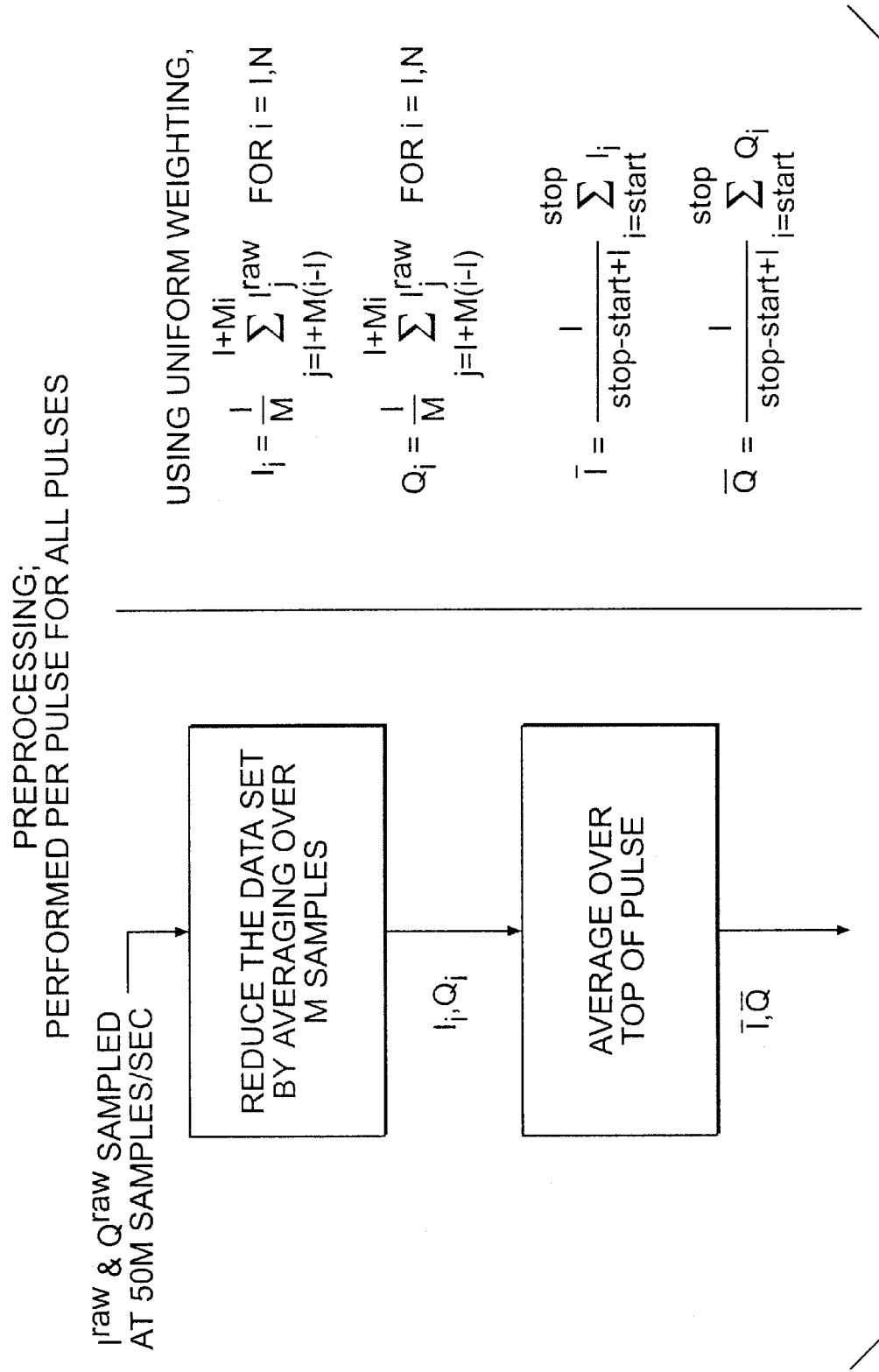
FIGS. 4a. through 4h. are a flowchart depicting the process of the present invention.
Figure 4B:
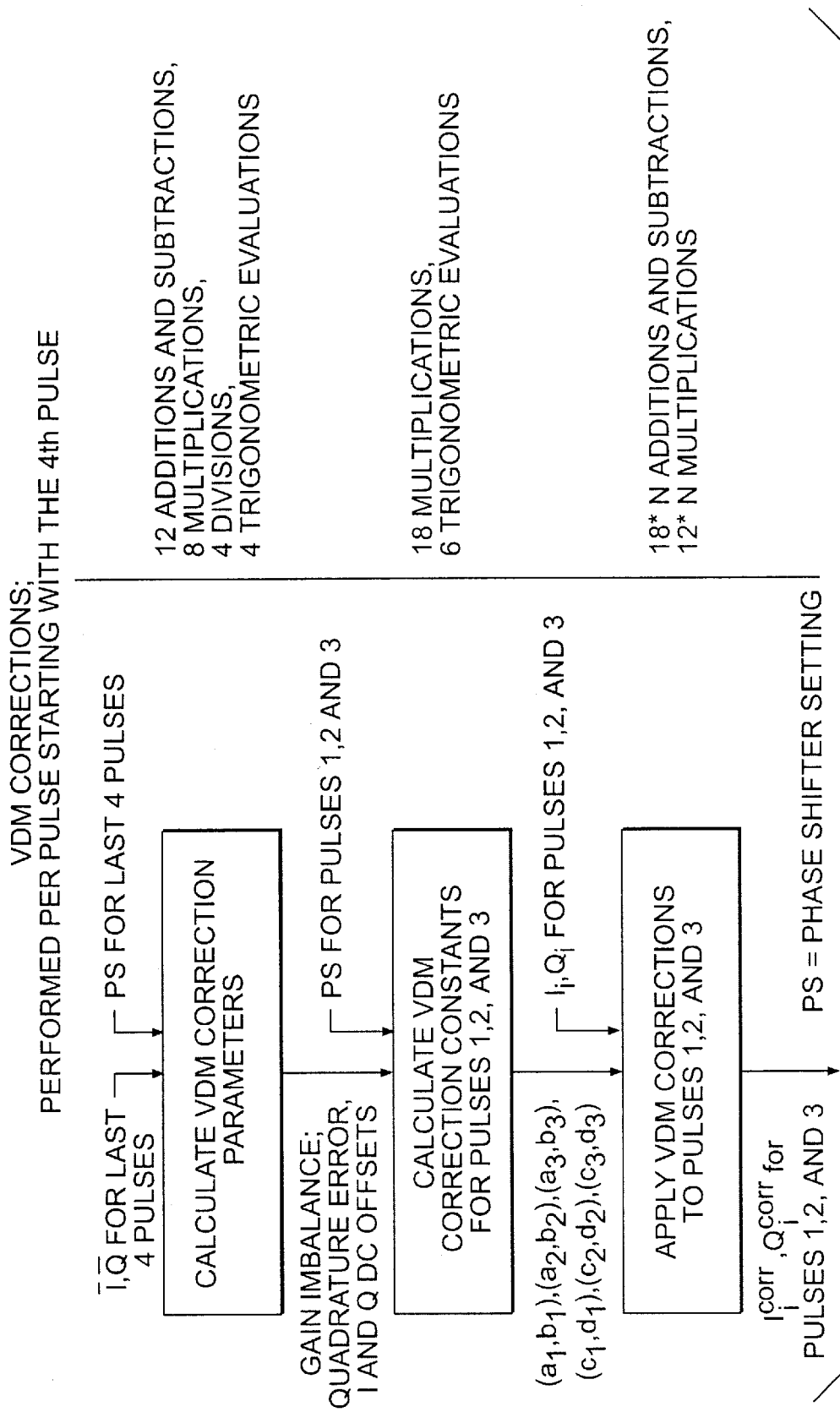
Figure 4C:
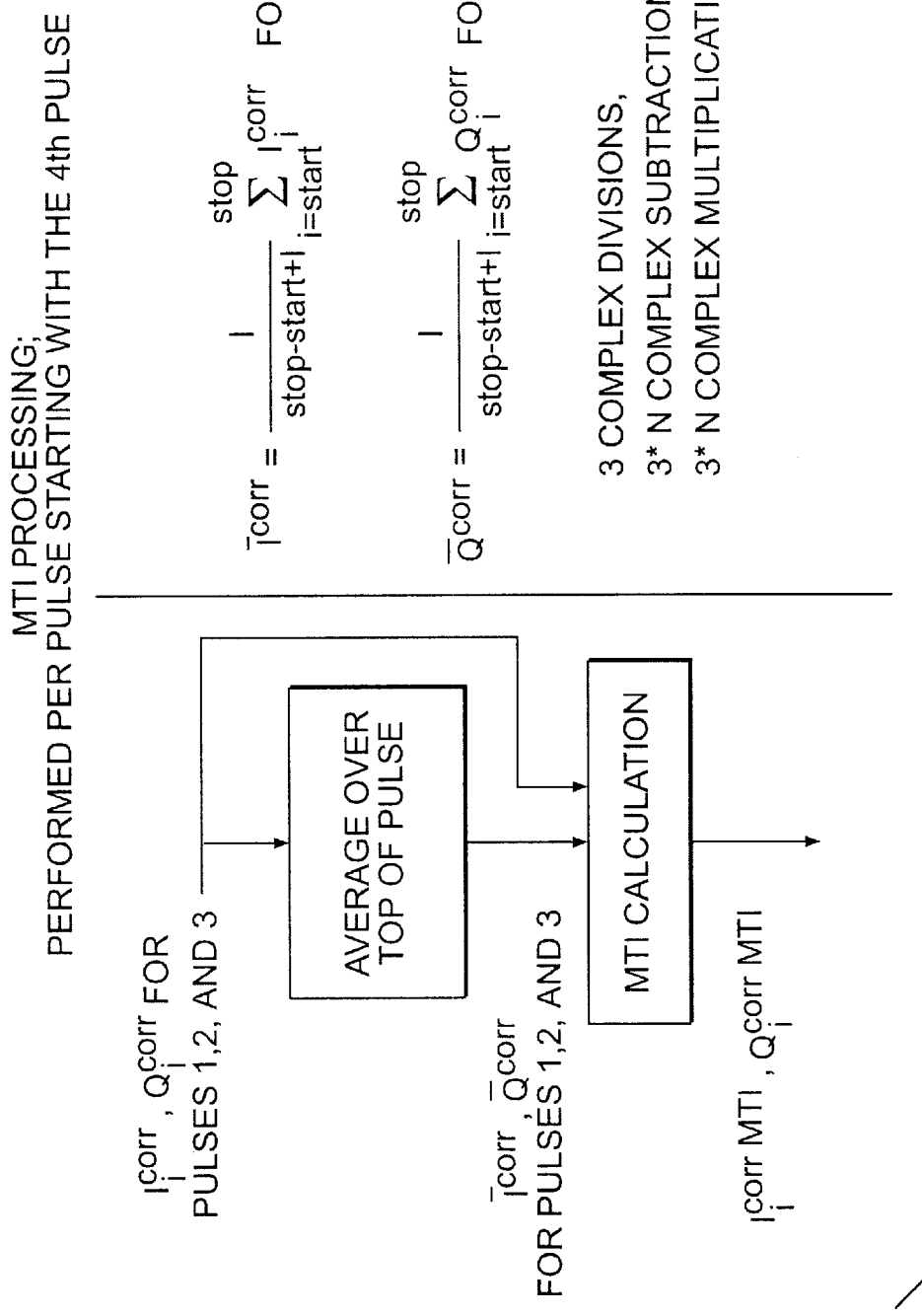
Figure 4D:
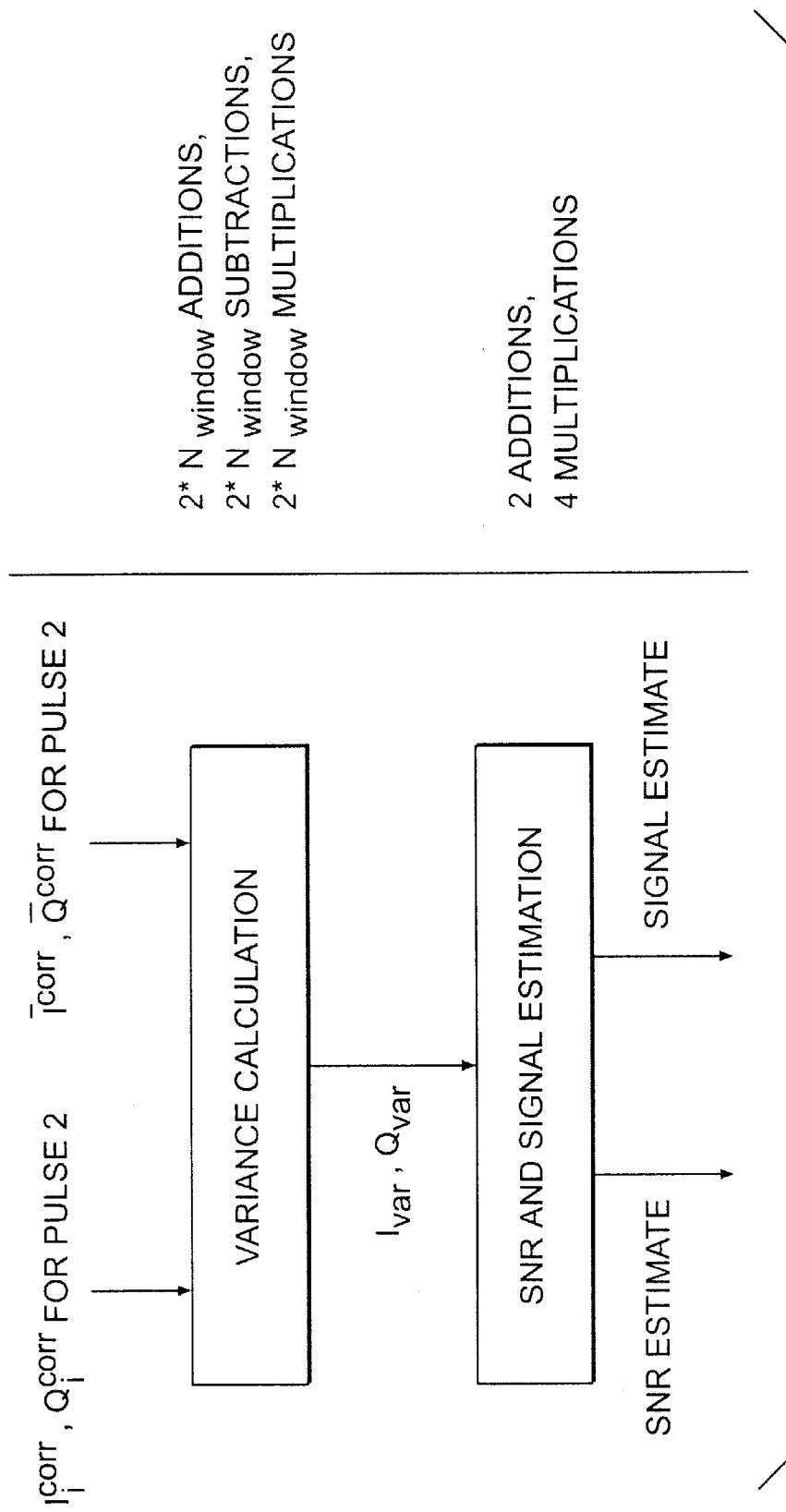
Figure 4E:
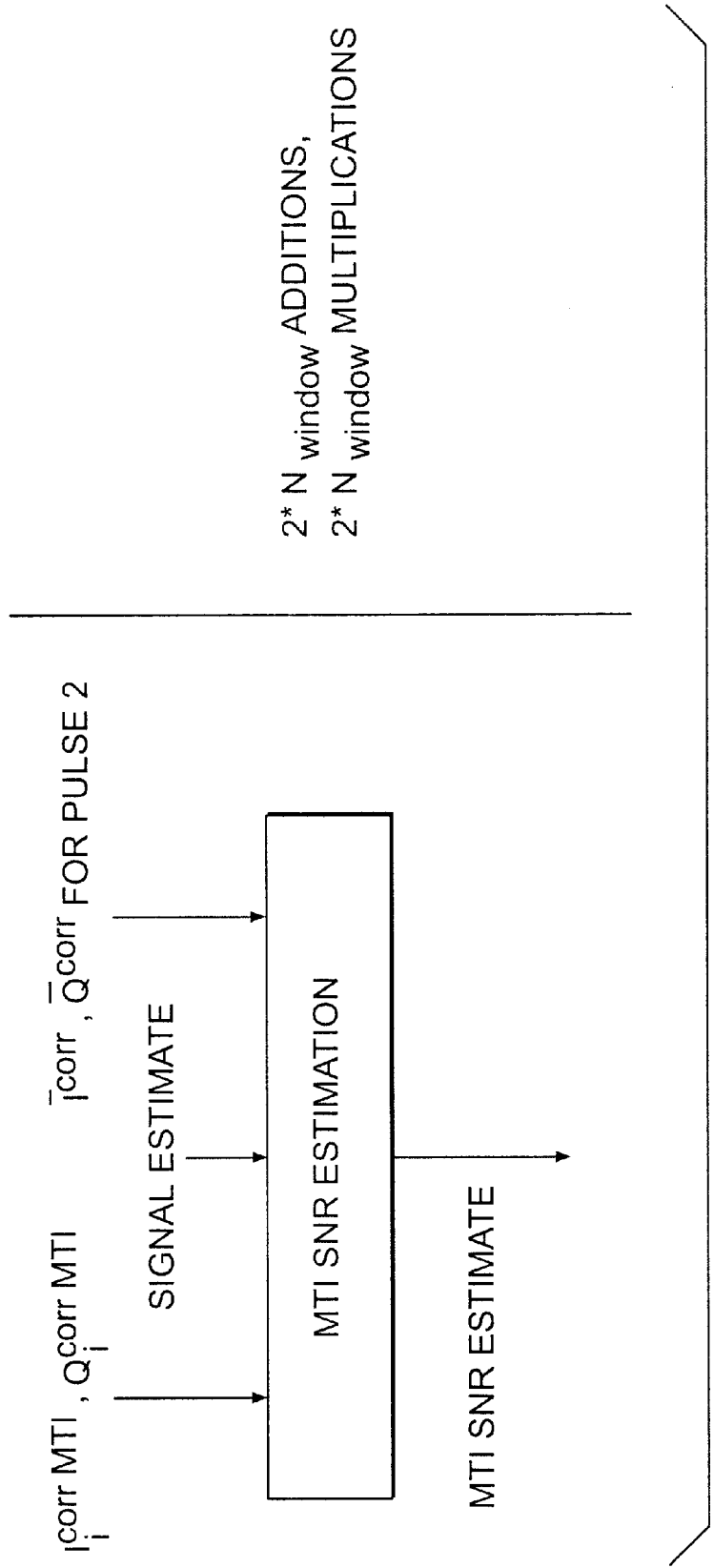
Figure 4F:
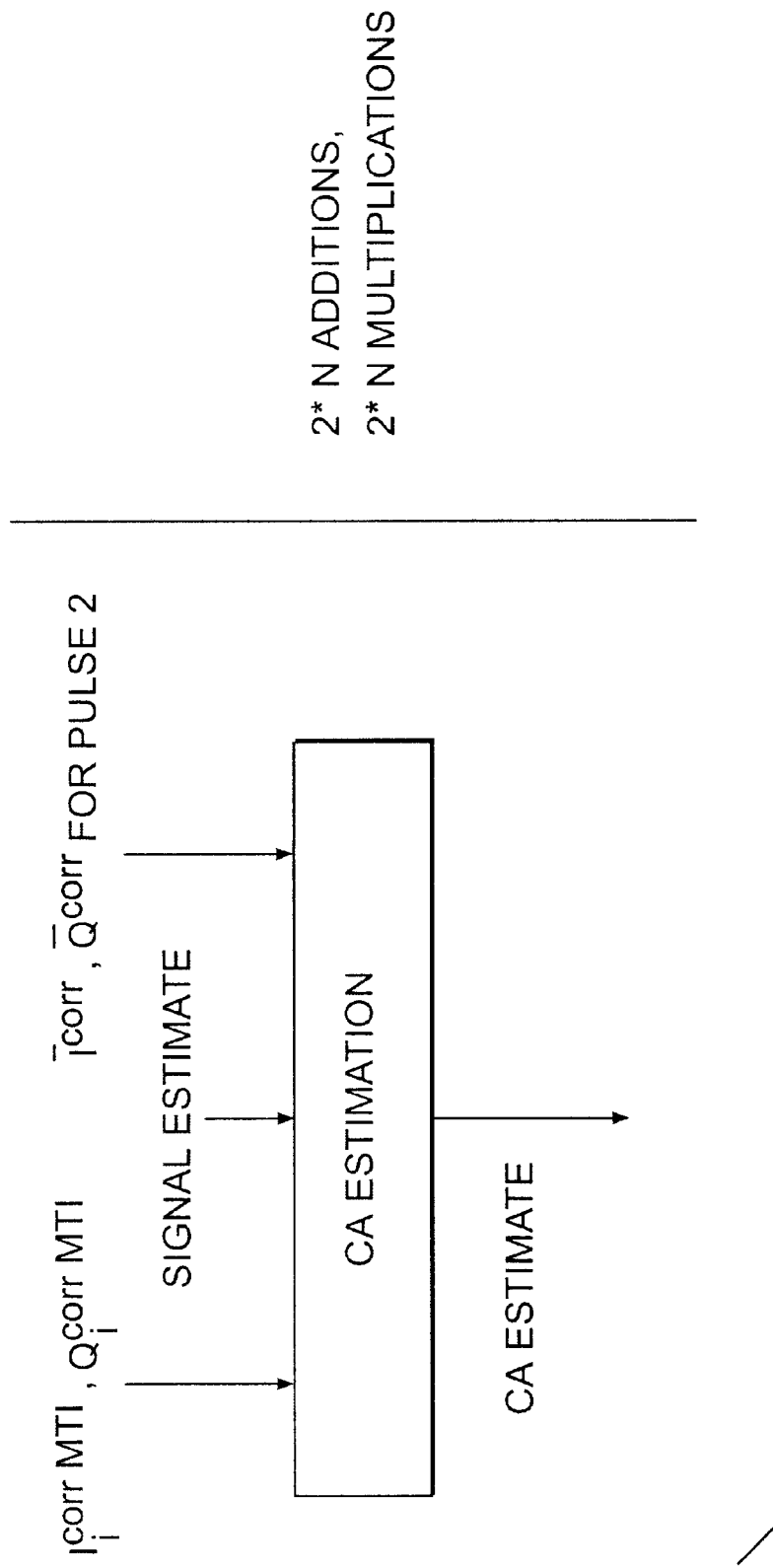
Figure 4G:
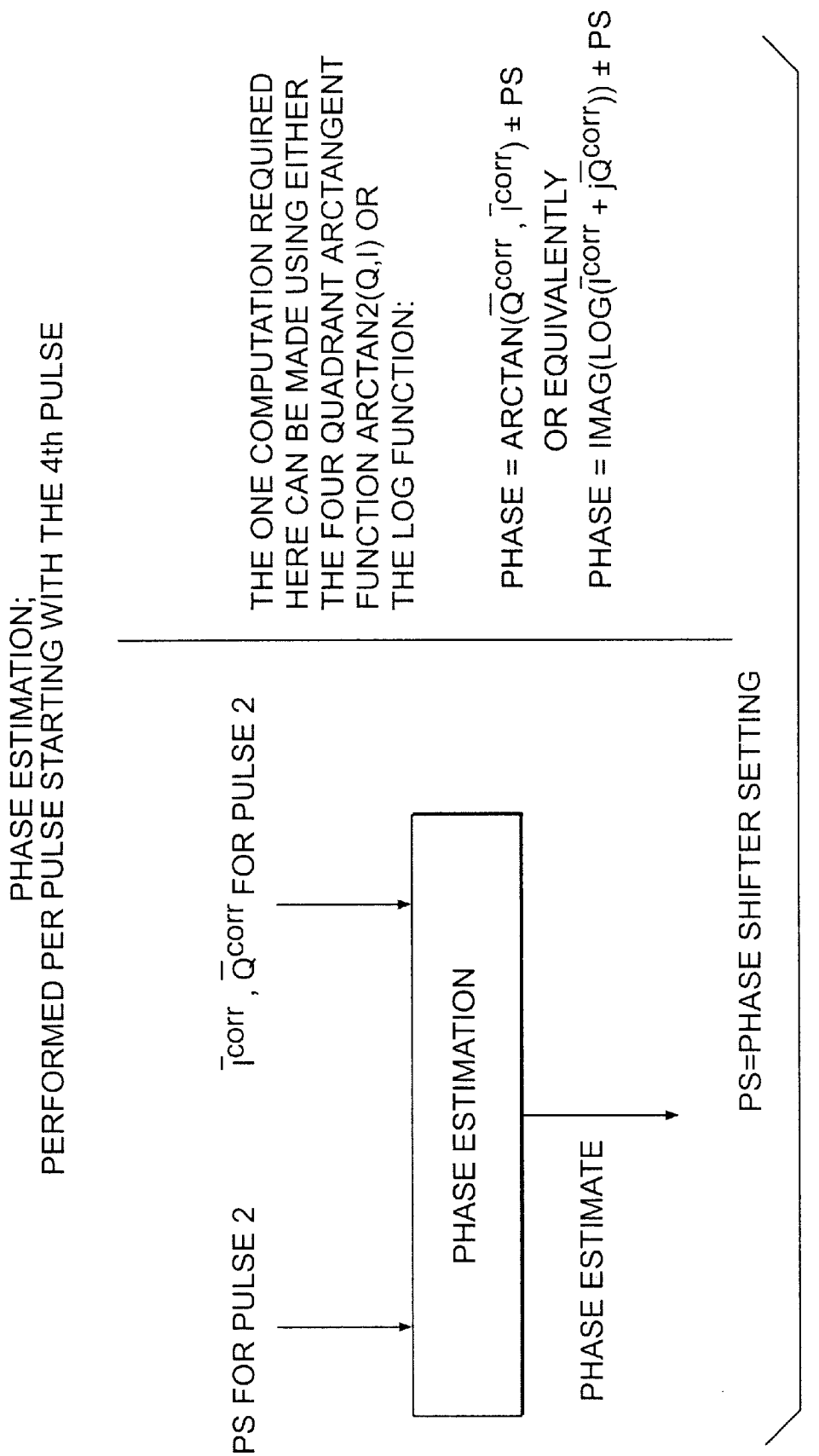
Figure 4H:
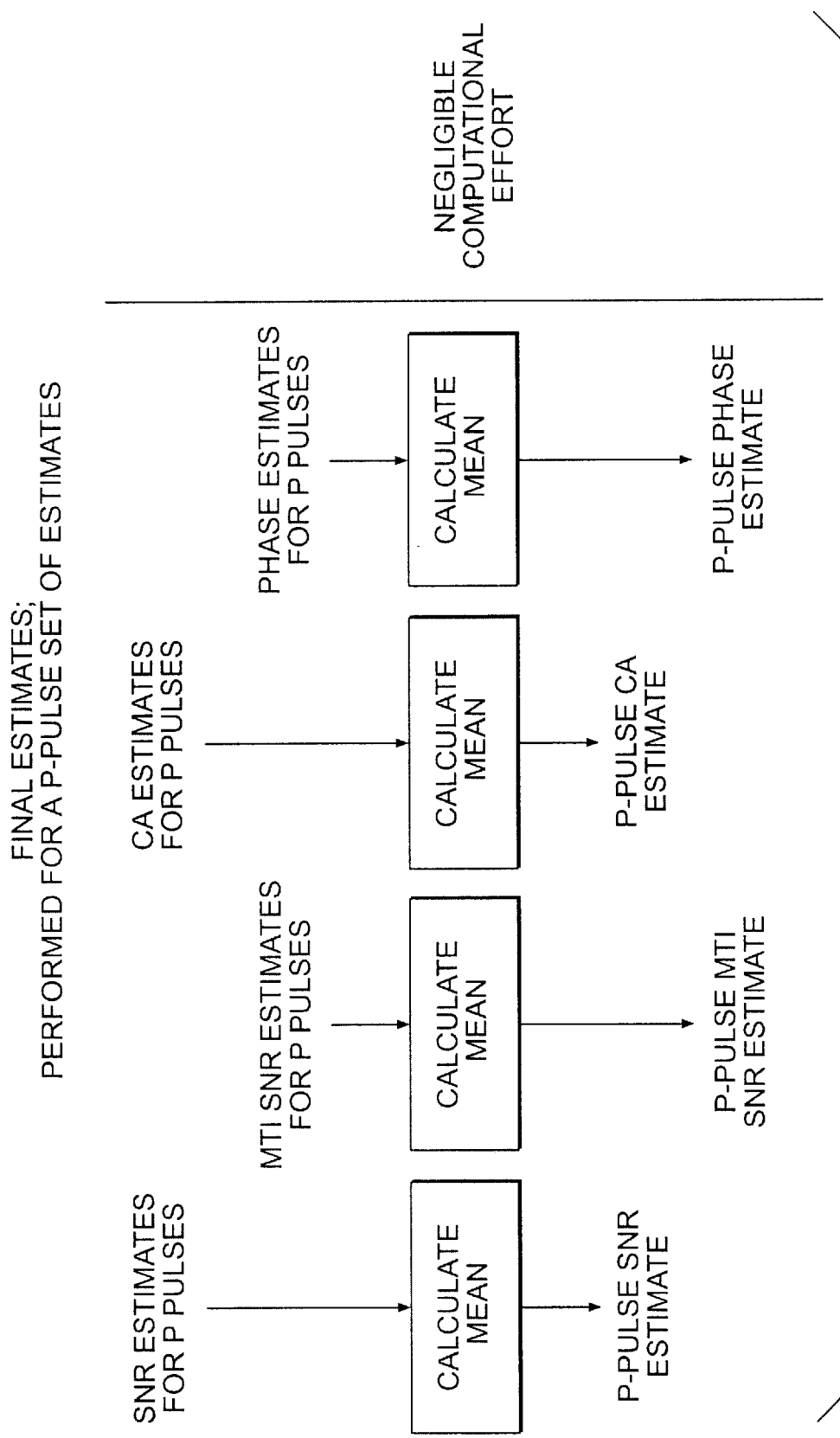
Figure 7:
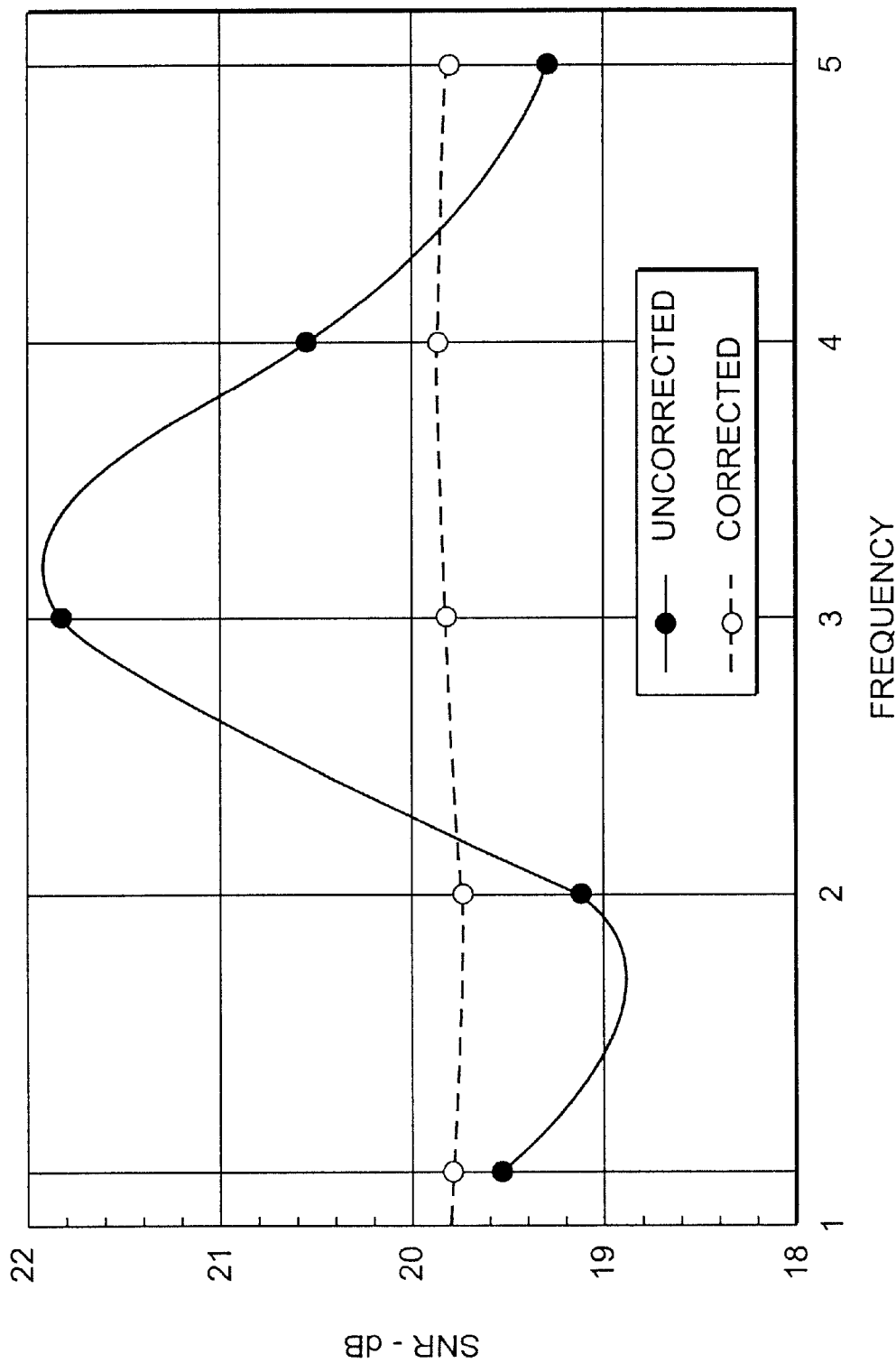
FIG. 7 is a graph of a comparison of conventional SNR measurements with the measurements made by the present invention.

Finally, in this example, and not by way of limiting the claimed invention, the signal-to-noise ratio was computed for the entire group of pulses in the data base. The errors caused by linear distortion were removed because the average of sinusoidal functions over N cycles is zero. FIG. 7 illustrates the accuracy improvement obtained using the procedure of the present invention. A test was performed using a −20 dB sine wave offset by 1 MHZ with respect to the signal to simulate noise. Following the conventional test procedure, the phase of the signal was set to 0°, where the effect of gain imbalance is a maximum, and quadrature phase error is a maximum. The resulting measured SNR varies by about +2 and −1 dB from the correct SNR, and the shape of the curve closely resembles the gain imbalance curve of FIG. 3. The VDM parameters are listed in Table 1.

TABLE 1

Performance of Vector Demodulator with −20 dB sine wave

| Frequency | Gain Imbalance (dB) | Quadrature Error (degrees) | DC Offset Magnitude (%) | DC Offset Phase (degrees) | 20 dB SNR Cal Uncorrected (dB) | 20 dB SNR Cal Corrected (dB) |
|---|---|---|---|---|---|---|
| 1 | −0.27 | −10.67 | 0.007 | −144 | 19.59 | 19.80 |
| 2 | −0.66 | −1.59 | −0.011 | −117 | 19.15 | 19.73 |
| 3 | +1.58 | −6.87 | 0.006 | −147 | 21.82 | 19.80 |
| 4 | +0.56 | −14.13 | 0.014 | −130 | 20.52 | 19.84 |
| 5 | 0.64 | −8.52 | 0.009 | −158 | 19.28 | 19.82 |
| H | 0.11 | −8.36 | 0.009 | −139 | 20.07 | 19.796 |
| σ | 0.96 | 4.66 | 0.003 | 16 | 1.11 | .037 |

Following the process of the present invention, the average measured SNR is 19.80 dB with a deviation of 0.04 dB averaged across the 12% measurement band. The −0.2 dB bias error from the ideal 20.0 dB SNR is attributed to two sources: rf attenuator error, and low pass filter attenuation at the 1.0 MHZ difference frequency. This bias can be reduced further by calibration.

In alternative embodiments of the present invention, the analog 5 MHZ 6-pole Bessel low-pass filters 1700, preceding the digitizer, are removed, replaced, and/or modified. The response of the 5 MHz 6 pole Bessel Filters (and their noise bandwidth) is defined with the precision of the filter coefficients and will be identical in all tests sets. The anti-aliasing function is provided by 14 MHZ (−3 dB) analog low pass filters which have over 50 dB attenuation at the Nyquist frequency. Since they have a much wider bandwidth than the digital filters, their response over the noise measurement band is flat and does not affect the SNR.

The specific parameters of the filter means 1700 are not critical. Filters of this type are known prior to the present invention and persons skilled in the art are knowledgeable regarding the selection of filter parameters to achieve the desired effect. These filters serve the purposes of: (1) defining the bandwidth of the noise included in the measurement; and (2) preventing aliasing of noise components above the 25 MHZ Nyquist frequency. However, filters typically required calibration of their effective noise bandwidth.

In a preferred embodiment of the present invention, the bandwidth limiting function may be implemented by digital filters 1700, coded into the signal processing software. In other embodiments of the invention, the digital filters have been eliminated. Although the digital filters 1700 are not required to practice the present invention, without them limits are imposed on the sensitivity of the instrument. Absent the digital filters 1700, the invention cannot readily measure the high signal-to-noise ratio. It may, in other words, deliver high accuracy but not high sensitivity.

Because the digital filters necessarily follow the A/D converters, they remove the quantization noise in the frequency band between the 5 MHZ cutoff of the digital filter and the Nyquist frequency. This lowers the noise floor of the measurement system by the ratio of these two numbers, or 7 dB.

The SNR computed for each I/Q sample pair is averaged over a large number of data samples to reduce the standard deviation of the measured output. The standard deviation is given by the formula:

$$\sigma_{dB} = 10 \log\left(1 + \frac{1}{\sqrt{M}}\right)$$

where M=number of independent noise samples. For example, if M=10 E4, σ=0.04 dB. The actual value used in the procedure is a tradeoff between accuracy and processing time in the computer. To maximize accuracy, the applications software operating on the raw data must be efficiently written and compiled. A faster computer permits more data samples to be averaged within an allotted test time.

Figure 8:
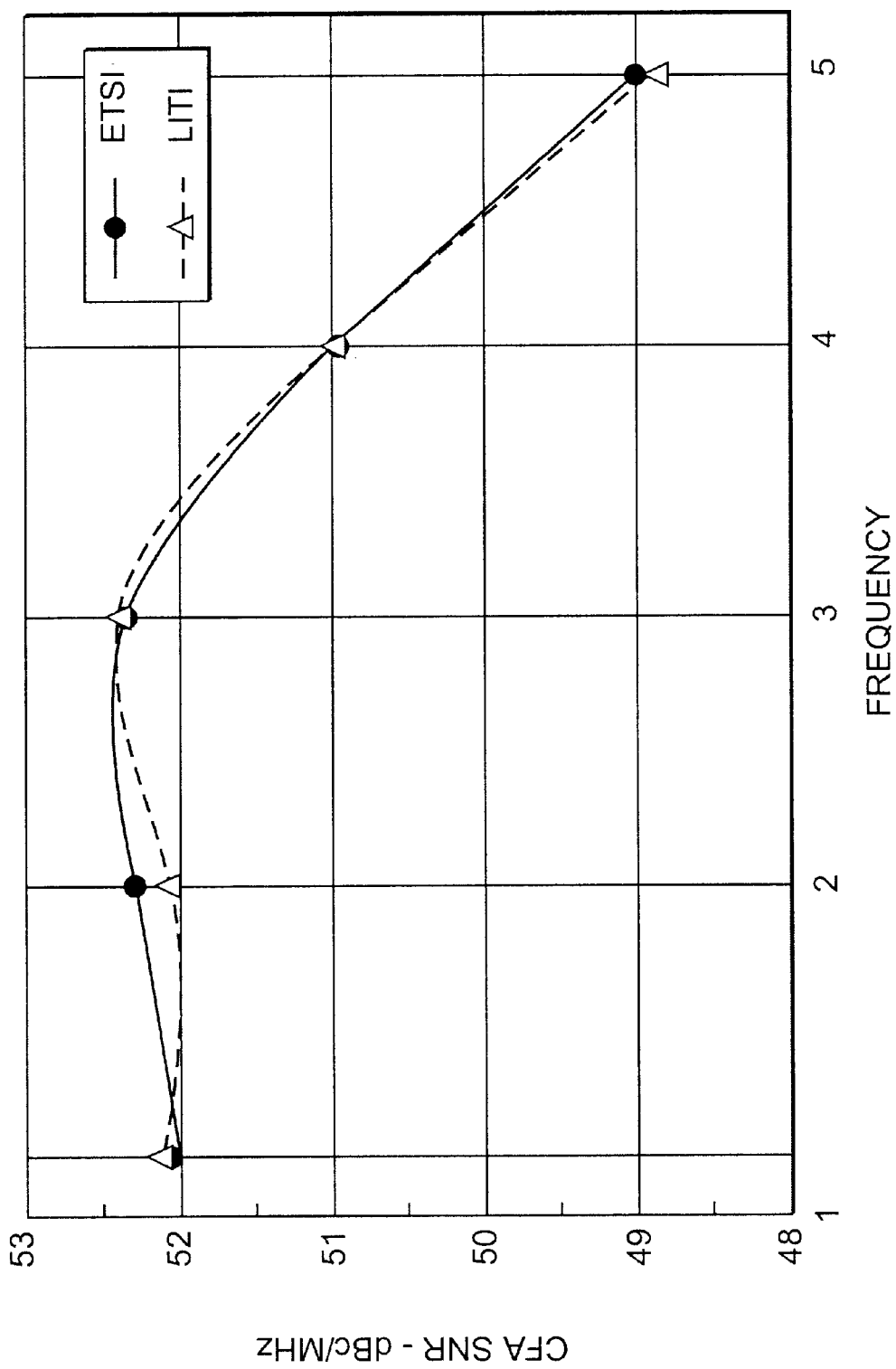
FIG. 8 is a graph of noise measurements made using different noise test sets.

The process and apparatus of the present invention provide improved speed as well as accuracy. Preferably, the invention uses a single VDM. SNR results are shown in FIG. 8. The two curves differ by 0.12 dB rms averaged across the measurement band, the worst case differential error is 0.23 dB at frequency F2. This evaluation used 2,000 independent noise samples.

The inventor has found that averaging over a large number of samples enhances the effective and efficient measurement of signal-to-noise ratio and other performance parameters of microwave components. Prior techniques took too long, or if they were reasonably rapid, did not acquire sufficient data to develop an effective average. Prior processes were constrained to the point that they were unable to secure enough averaging to get an accurate answer. The present invention, on the other hand, uses averaging to reduce errors to small number. The inventor considers the formula to be preferable but not critical to the practice of the present invention.

The greatest accuracy is obtained from the present invention when M is a large number, such as 1000 or 2000. When M is large, statistical error becomes very small. It is practicable to secure a large number of measurements (M) by building an instrument that works fast. The prior art, in contrast, was slow. Prior to the present invention, standard practice was to acquire only about 30 data measurements. Thirty measurements, however, is not enough to achieve the high accuracies of the present invention. The present invention provides a fast measurement system, method, and apparatus, that is one that is capable of rapid measurement of a large number of data points (that is, where M>>30).

Another factor limiting the accuracy and speed of prior measurements was that computation prior to the present invention, with a general purpose computer, took too long. This factor extended the time required to make each measurement or evaluate each parameter, limiting the number of components and/or parameters that could be tested in a reasonable time. One of the significant benefits of the present invention is to employ a special—rather than general—purpose instrument, involving a specially programmed computer, to make these calculations and perform them rapidly, to achieve a high degree of accuracy. In so doing, the process and apparatus of the present invention has increased the number of measurements from about 30 to about 2000, at a rate that is a couple of hundred times faster than previously known, and at accuracies 10 times to 100 better than previously known apparatus and techniques.

TABLE 2

Comparison of errors from two vector demodulators: ETSI and LITI

| VDM Frequency | ETSI | | LITI | |
|---|---|---|---|---|
| | Gain (dB) | Phase (degrees) | Gain (dB) | Phase (degrees) |
| 1 | −0.3 | −9 | 2.2 | −1 |
| 2 | −0.7 | 0 | −0.4 | 7 |
| 3 | 1.6 | −5 | 0.3 | 4 |
| 4 | 0.7 | −14 | 0.9 | 12 |
| 5 | 0.8 | −10 | 0.1 | 8 |

The overall error of the new procedure is estimated to be:

| noise uncertainty | 0.09 |
|---|---|
| residual hardware errors | 0.04 |
| overall RSS error | 0.10 dB |

In the above example of the invention, in order to achieve a 0.09 dB noise uncertainty, 2,200 independent noise samples were averaged. Prior to the invention, the operator had to chose between speed and accuracy of measurement. The present invention facilitates both speed and accuracy. The value of M in the present invention is typically controllable by the operator, whereas, it was not so controllable prior to the present invention.

The invention computes signal-to-noise ratio as a ratio, and not an absolute value. The technique therefore requires little in the way of calibration, as long as the demodulator operates in a linear regime. To assure that the potential error sources remain small, and non-linear products are kept within acceptable limits, a diagnostic routine was added to the processing software to display the following parameters:

dc offset;

gain imbalance;

quadrature phase error; and third harmonic level.

These values can be checked by the operator (or flagged in the software) if they exceed expected limits.

The hardware used in the present invention is rapidly evolving. It is intended that the invention include and incorporate these advances in the art. In a preferred embodiment of the present invention, state-of-the-art A/D converters are employed in order to maximize the dynamic range of the SNRM demonstration model. The availability of suitable substitutes for this component is very dynamic, as new components are being announced virtually every month. Analog Devices manufactures a design that operates at 12-bit resolution at 105 Samples/sec. Analog Devices has more recently developed a 14-bit 65 M Samples/sec. converter.

There are a number of differences between the present invention and prior known systems. In one embodiment of the present invention, the LO reference signal is offset in frequency from the rf signal by a small amount, and data is collected over a time base T=N/$\Delta$f, where $\Delta$f=LO frequency offset and N is an integer. Therefore the data values are uniformly distributed over all values of $\theta$ and any cyclic errors can be removed by averaging.

Additional components have been modified to provide a rf range from 2.0 to 18 GHz, or 0.5 to 18 GHz in a preferred embodiment of the present invention. In a preferred embodiment, the present invention includes an rf Component, in the range of 0.5 to 18 GHz. Components in the range of 2–18 GHz are readily available at reasonable cost. This represents is a substantial increase in rf bandwidth. The inventor believes that components will perform in the 0.5 to 2.0 GHz frequency with somewhat degraded performance, but may still be good enough to satisfy SNRM requirements. In a preferred embodiment, the present invention uses components in the 0.5–2.0 GHz range. Components for the 0.5–2.0 GHz range are readily available at very low cost, so a second rf board covering this frequency band may be added, if desired.

In an present preferred embodiment of the present invention, the inventor employed the following components:

| Component | Manufacturer | Model | No. Required |
|---|---|---|---|
| rf amplifier | JCA | JCA 218–426 | 1 |
| mixer | Miteq | DB0218 LW2 | 4 |
| coupler 0° | Merrimac | PDM-24M-10G | 3 |
| coupler 90° | Krytar | 1830 | 2 |

These components are preferably mounted on a full length ISA card in a portable computer chassis along with the phase shifter control circuitry.

In a preferred embodiment of the present invention, tradeoffs are being made on where and how the data collected by the A/D converters is processed to minimize the time delay between raw data collection and processed data display. The inventor has identified four primary measurement functions:

| Function | Application |
|---|---|
| Signal-to-Noise Ratio | Measure of the broadband noise on the top of a radar pulse, averaged over many pulses |
| MTI | Measurement of the broadband noise of 3 consecutive pulses, coherently added (as in the SPY-1 signal processor) and averaged over many triplets. |
| Clutter Attenuation | Measurement of the instability over the entire pulse (i.e., rise, top and fall) using coherent processing of 3 consecutive pulse and averaging over many triplets |
| Insertion Phase | Computation of insertion phase using data acquired in a window at the top of the pulse. This function can be used to rapidly match channel delays, and in phase linearity/similarity measurements across an operational bandwidth. |

All of these functions require the same raw data input. The difference is primarily in how the data is processed and displayed. In a preferred embodiment of the present invention, the process proceeds as depicted in the top-level flow diagram of the required computations, as presented in FIG. 4. FIG. 4 depicts the underlying equations, together with estimates of the number of computational operations required, of a preferred embodiment of the present invention.

It will be apparent to one of ordinary skill in the art of the present invention that various modification and variations can be made in several features of the invention. Several of these modifications and variations are identified above. Additional variations and modifications might include, for example, the use of: dedicated hardware; fixed digital hardware; programmable digital hardware; a digital signal processor (DSP) programmed in assembly language; a DSP programmed in C language; special purpose software resident in the host computer; and LabView® software resident on the host computer. These variations are intended to provide the user flexibility and not constrain the invention. Thus, it is intended that the variations and modification be considered part of the invention, provided they come within the scope of the appended claims and their equivalents.

The invention can be packaged in any number of ways, provided the packaging provides the desired degree of portability, ruggedness, and ease of access. In a preferred embodiment of the present invention, the device is packaged in a portable, rugged, IBM-compatible personal computer housing. The preferred packaging is an Intel® Pentium III, 450 MHZ, 128 MB RAM, with an 8 GB Hard Drive, with standard keyboard and active matrix display device. These packages have ample space for insertion of the Microwave Component Analyzer special cards (e.g., DSP, rf, IEEE-488, A/D). Some data on these is contained in Appendix B to the SBIR Phase II Report, which is incorporated herein by reference. The present invention has reduced the weight and size of the apparatus from over about 120 pounds, and over about 4,000 cubic inches to about 45 lbs., housed in a 1,923 cubic inch housing, the size of a portable personal computer. The inventor anticipates that continued advances in chip design, packaging, and performance will further reduce the size and weight of the packaging of the present invention.

In a preferred embodiment, components provided function in the 2–18 GHz, and preferably 0.5–18 GHz range, are included on a circuit card. Phase shifter control and power distribution controls are preferable added to the board as well. The precise code used to implement the present invention is not considered critical. Rather, the algorithms employed—or equivalent algorithms—are considered critical. It is a matter of routine software development to employ those algorithms in a useful device of the present invention.

In a preferred embodiment, A/D converters are included for the measurement of signal-to-noise ratio and are integrated into the digital signal processor (DSP) card. The computational algorithms and their implementation may be fabricated and installed as either software, or hardware on a separate card inserted into the PC.

It will be apparent to those skilled in the art that various modifications and variations can be made in the system, process, and/or apparatus of the present invention, without departing from the scope or spirit of the invention. For example, the algorithms may be coded into software or installed as hardware. The configuration of the analysis means and packaging may take any suitable form. The invention may be portable, but is not necessarily so. Thus, it is intended that the present invention cover the modifications and variations of the invention provided they come within the scope of the appended claims and their equivalents.

I claim:

1. A method for the measurement of selected fundamental performance parameters of a test unit, comprising the steps of:
   a. generating a first reference signal;
   b. generating a second reference signal, that is rotated in phase relative to said first reference signal;
   c. supplying said first reference signal to the test unit;
   d. supplying the output of the test unit to vector demodulator means, wherein the test unit output comprises an rf signal;
   e. supplying said second reference signal to vector demodulator means, wherein the vector demodulator means comprises first vector demodulator means for receiving said rf signal from the test unit and second vector demodulator means for receiving said second signal;
   f. generating a signal from vector modulator means; and
   g. processing said signal from said vector demodulator means to determine the selected fundamental performance parameters of the test unit.

2. The method of claim 1, wherein said processing said signals from said vector demodulator means further comprise
   a. said signal being I and Q signals,
   b. digitizing said I and Q signals, and
   c. supplying said digitized signals to computer means for determining the fundamental performance parameters of the test unit.

3. The method of claim 1 wherein said fundamental performance parameter comprises signal-to-noise ratio.

4. The method of claim 1 wherein said fundamental performance parameter comprises moving target indicator.

5. The method of claim 1 wherein said fundamental performance parameter comprises clutter attenuation.

6. The method of claim 1 wherein the fundamental performance parameter comprises phase gain.

7. The method of claim 1 wherein the fundamental performance parameter comprises phase insertion.

8. The method of claim 1 wherein the selected performance parameter comprises signal-to-noise ratio and the method determines said signal-to-noise ratio to an accuracy of less than or equal to about ±0.2 dB.

9. The method of claim 1 wherein the selected performance parameter comprises signal-to-noise ratio and the method determines said signal-to-noise ratio to an accuracy of less than or equal to about ±1.5 dB, in less than about 3 seconds.

10. The method of claim 1 wherein the selected performance parameter comprises signal-to-noise ratio and the method determines said signal-to-noise ratio to an accuracy of less than or equal to about ±1.5 dB, through the use of a light weight, portable apparatus.

11. The method of claim 1 wherein the selected performance parameter comprises signal-to-noise ratio and the method determines said signal-to-noise ratio to an accuracy of less than or equal to about ±0.1 dB, in less than or equal to about 3 seconds.

12. A method for measurement of selected fundamental performance parameters of a test unit, comprising the steps of:
   a. generating a first reference signal;
   b. generating a second reference signal, that is rotated in phase relative to said first reference signal;
   c. supplying said first reference signal to the test unit;
   d. supplying the output of the test unit to vector demodulator means, wherein the test unit output comprises an rf signal;
   e. supplying said second reference signal to vector demodulator means, wherein the vector demodulator means comprises first vector demodulator means for receiving said rf signal from the test unit and second vector demodulator means for receiving said second signal;
   f. generating I and Q signals from vector modulator means;
   g. digitizing said I and Q signals from said vector demodulator means;
   h. coordinating said digitizing with said first reference signal generator through clock means; and
   i. processing said coordinated digitized I and Q signals to determine the selected fundamental performance parameters of the test unit.

13. The method of claim 12, wherein said processing said digitized I and Q signals further comprises supplying said digitized signals to specialized computer means for determining the fundamental performance parameters of the test unit.

14. The method of claim 12 wherein the fundamental performance parameter comprises signal-to-noise ratio.

15. The method of claim 12 wherein the fundamental performance parameter comprises moving target indicator.

16. The method of claim 12 wherein the fundamental performance parameter comprises clutter attenuation.

17. The method of claim 12 wherein the fundamental performance parameter comprises phase gain.

18. The method of claim 12 wherein the fundamental performance parameter comprises phase insertion.

19. The method of claim 12 wherein said selected performance parameter comprises signal-to-noise ratio and the method determines said signal-to-noise ratio to an accuracy of less than about ±1.5 dB, in less than about 3 seconds.

20. The method of claim 12 wherein said selected performance parameter comprises signal-to-noise ratio and the method determines said signal-to-noise ration to an accuracy of less than or equal to about ±1.5 dB, through the use of apparatus weighings less than about 50 pounds.

21. The method of claim 12 wherein said selected performance parameter comprises signal-to-noise ratio and the method determines said signal-to-noise ratio to an accuracy of less than or equal to about ±0.2 dB , in less than or equal to about 3 seconds, through the use of an apparatus weighing less than about 50 pounds.

22. The method of claim 12 wherein said selected performance parameter comprises signal-to-noise ratio and the method determines said signal-to-noise ratio to an accuracy of less than or equal to about ±0.2 dB, in less than or equal to about 3 seconds.

23. The method of claim 12, wherein said method determines the fundamental performance parameter to an accuracy of less than or equal to about ±0.1 dB, in less than or equal to about 3 seconds.

24. A method for improving the accuracy of measurement of the performance of selected fundamental parameters of a test unit, comprising:
   a. generating a first reference signal;
   b. generating a second reference signal, that is rotated in phase relative to said first reference signal;
   c. supplying said first reference signal to the test unit;
   d. supplying the output of the test unit to vector demodulator means;
   e. supplying said second reference signal to vector demodulator means;
   f. generating I and Q signals from vector modulator means;
   g. digitizing said I and Q signals from said vector demodulator means;
   h. coordinating said digitizing with said first reference signal generator through clock means;
   i. sampling said I and Q signals from vector demodulator means;
   j. reducing the data set of said measured said I and Q signals, by averaging over M samples, where M is greater than or equal to 30;
   k. estimating average I and Q values, by averaging said reduced data set; and
   l. calculating the selected performance parameter.

25. The method of claim 24 wherein the selected performance comprises VDM Correction and the method further comprises:
   a. estimating average I and Q values for a selected data collection window;
   b. determining phase rotation settings of said second signal for last four pulses;
   c. calculating VDM correction parameters;
   d. assessing gain imbalance, quadrature error, I and Q DC offsets;
   e. determining phase rotation settings of said second signal for pulses 1, 2, and 3;
   f. calculating VDM correction constants for pulses 1, 2, and 3;
   g. determining data for pulses 1, 2, and 3, and said reduced data for pulses 1, 2, and 3;
   h. supplying phase rotation settings of said second signal for pulses 1, 2, and 3;
   i. applying VDM corrections to pulses 1, 2, and 3; and
   j. calculating corrected values of I and Q for pulses 1, 2, and 3.

26. The method of claim 25, wherein the selected performance parameter comprises MTI, and the method further comprises:
   a. averaging said corrected values of I and Q for pulses 1, 2, and 3 over the top of the pulse;
   b. supplying said averaged corrected values of I and Q, along with said corrected values of I and Q; and
   c. calculating MTI.

27. The method of claim 26, wherein the selected performance parameter comprises signal-to-noise ratio, and the method further comprises:
   a. supplying said corrected values of I and Q for pulse 2;
   b. supplying said averaged corrected values of I and Q for pulse 2;
   c. calculating the variance;
   d. calculating signal-to-noise ratio from said variance;
   e. estimating signal-to-noise ratio; and
   f. estimating signal.

28. The method of claim 27, wherein the selected performance parameter comprises MTI SNR, and the method further comprises:
   a. supplying corrected values of I and Q for pulse 2;
   b. supplying said averaged corrected values of I and Q for pulse 2;
   c. supplying a signal estimate;
   d. estimating MTI SNR from said corrected values, said average corrected values and said signal estimate to estimate MTI SNR.

29. The method of claim 28, wherein the selected performance parameter comprises clutter attenuation, and the method further comprises:
   a. supplying corrected values of I and Q;
   b. supplying said averaged corrected values of I and Q for pulse 2;
   c. supplying a signal estimate;
   d. estimating Clutter Attenuation from said corrected values, said average corrected values and said signal estimate to estimate clutter attenuation.

30. The method of claim 28, wherein the selected performance parameter comprises phase estimation, the method further comprises:
   a. determining the phase shifter setting for pulse 2;
   b. supplying said phase shifter setting;
   c. and estimating phase from said phase shifter setting and said corrected values of I and Q for pulse 2.

31. The method of claim 24, wherein the selected performance parameter comprises signal-to-noise ratio, moving target indicator, moving target indicator signal-to-noise ratio, clutter attenuation, and phase estimates, and the method further comprises:
   a. calculating the mean signal-to-noise ratio estimate;
   b. calculating the mean MTI SNR estimate;
   c. calculating the mean clutter attenuation estimate; and
   d. calculating the mean phase estimate.

32. The method of claim 24, wherein said processing said digitized I and Q signals further comprises supplying said digitizing signals to specialized computer means for determining the fundamental performance parameters of the test unit.

33. The method of claim 24 wherein the fundamental performance parameter comprises signal-to-noise ratio.

34. The method of claim 24 wherein the fundamental performance parameter comprises moving target indicator.

35. The method of claim 24 wherein the fundamental performance parameter comprises clutter attenuation.

36. The method of claim 24 wherein the fundamental performance parameter comprises phase gain.

37. The method of claim 24 wherein the fundamental performance parameter comprises phase insertion.

38. The method of claim 24 wherein said selected performance parameter comprises signal-to-noise ratio and the method determines said signal-to-noise ratio to an accuracy of less than about ±1.5 dB, in less than about 3 seconds.

39. The method of claim 24 wherein said selected performance parameter comprises signal-to-noise ratio and the method determines said signal-to-noise ratio to an accuracy of less than or equal to about ±0.1 dB, in less than or equal to about 3 seconds.

40. The method of claim 24 wherein said selected performance parameter comprises signal-to-noise ratio and the method determines said signal-to-noise ratio to an accuracy of less than or equal to about ±1.5 dB, in less than or equal to about 3 seconds, through an apparatus weighing less than about 50 pounds.

41. An apparatus for the measurement of fundamental parameters of a test unit, comprising:
   a. a first signal generator means, for generating a first signal having first phase;
   b. phase shifter means, cooperating with said first signal generator means, for rotating the phase of said first signal to produce a second signal having a second phase, wherein said second signal is shifted in phase relative to said first signal;
   c. test unit input means, for supplying said first signal to said test unit input means;
   d. demodulator means, comprising first vector demodulator means for receiving said rf signal from the test unit and second vector demodulator means for receiving said second signal;
   e. means for supplying said second signal to said demodulator means; and
   f. data processing means for computing the fundamental parameter of the test unit from the output of said digitizer.

42. The apparatus of claim 41, further comprising digitizer means for digitizing the output of said demodulator means.

43. The apparatus of claim 41, further comprising digitizer means for digitizing the output of said demodulator means and clock means cooperating with said signal generator means and said digitizer means.

44. The apparatus of claim 41 wherein the fundamental performance parameter comprises signal-to-noise ratio.

45. The apparatus of claim 41 wherein the fundamental performance parameter comprises moving target indicator.

46. The apparatus of claim 41 wherein the fundamental performance parameter comprises clutter attenuation.

47. The apparatus of claim 41 wherein the fundamental performance parameter comprises phase gain.

48. The apparatus of claim 41 wherein the fundamental performance parameter comprises phase insertion.

49. The apparatus of claim 41 wherein said selected performance parameter comprises signal-to-noise ratio and the apparatus determines said signal-to-noise ratio to an accuracy of less than about ±1.5 dB, in less than about 3 seconds.

50. The apparatus of claim 41 wherein said selected performance parameter comprises signal-to-noise ratio, the apparatus determines said signal-to-noise ratio to an accuracy of less than about ±1.5 dB, and the apparatus weighs less than about 50 pounds.

51. The apparatus of claim 41 wherein said selected performance parameter comprises signal-to-noise ratio, the apparatus determines said signal-to-noise ratio to an accuracy of less than about ±1.5 dB, in less than about 3 seconds, and the apparatus weighs less than about 50 pounds.

52. The apparatus of claim 41 wherein said selected performance parameter comprises signal-to-noise ratio and the apparatus determines said signal-to-noise ratio to an accuracy of less than or equal to about ±0.2 dB, in less than or equal to about 3 seconds.

53. An apparatus for the measurement of fundamental parameters of a test unit, comprising:
   a. signal generator means, for generating a first signal having first phase;
   b. phase shifter means, cooperating with said first signal generator means, for rotating the phase of said first signal to produce a second signal having a second phase, wherein said second signal is shifted in phase relative to said first signal;
   c. test unit input means, for supplying said first signal to said test unit input means;
   d. vector demodulator means, for generating demodulator output signals, said vector demodulator means comprising first vector demodulator means for receiving said rf signal from the test unit and second vector demodulator means for receiving said second signal;
   e. digitizer means for digitizing demodulator output signals;
   f. clock means, cooperating with said signal generator means and said digitizer, for coordinating said digitizer; and
   g. data processing means for computing the fundamental parameter of the test unit from the output of said digitizer.

54. The apparatus of claim 53 wherein the fundamental performance parameter comprises signal-to-noise ratio.

55. The apparatus of claim 53 wherein the fundamental performance parameter comprises moving target indicator.

56. The apparatus of claim 53 wherein the fundamental performance parameter comprises clutter attenuation.

57. The apparatus of claim 53 wherein the fundamental performance parameter comprises phase gain.

58. The apparatus of claim 53 wherein the fundamental performance parameter comprises phase insertion.

59. The apparatus of claim 53 wherein said selected performance parameter comprises signal-to-noise ratio and the apparatus determines said signal-to-noise ratio to an accuracy of less than about ±1.5 , in less than about 3 seconds.

60. The apparatus of claim 53 wherein said selected performance parameter comprises signal-to-noise ratio, the apparatus determines said signal-to-noise ration to an accuracy of less than or equal to about ±1.5 dB, and the apparatus weighs less than about 50 pounds.

61. The apparatus of claim 53 wherein said selected performance parameter comprises signal-to-noise ratio, the apparatus determines said signal-to-noise ratio to an accuracy of less than or equal to about ±1.5 dB, in less than or equal to about 3 seconds, and the apparatus weights less than about 50 pounds.

62. The apparatus of claim 53 wherein said selected performance parameter comprises signal-to-noise ratio and the apparatus determines said signal-to-noise ratio to an accuracy or less than or equal to about ±0.2 dB, in less than or equal to about 3 seconds.

63. The apparatus of claim 53, wherein the apparatus weighs less than or equal to about 200 pounds.

64. The apparatus of claim 53, wherein the apparatus is less than about 4,000 cubic inches in volume.

* * * * *